(12) United States Patent
Okuno

(10) Patent No.: US 9,774,010 B2
(45) Date of Patent: Sep. 26, 2017

(54) LIGHT REFLECTIVE MATERIAL AND LIGHT-EMITTING DEVICE

(71) Applicant: Panasonic Intellectual Property Management Co., Ltd., Osaka (JP)

(72) Inventor: Tatsuya Okuno, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 212 days.

(21) Appl. No.: 14/868,390

(22) Filed: Sep. 29, 2015

(65) Prior Publication Data

US 2016/0109099 A1 Apr. 21, 2016

(30) Foreign Application Priority Data

Oct. 21, 2014 (JP) .................................. 2014-214417
Aug. 31, 2015 (JP) .................................. 2015-170111

(51) Int. Cl.

| H01L 33/00 | (2010.01) |
|---|---|
| H01L 51/52 | (2006.01) |
| H01L 33/48 | (2010.01) |
| H01L 33/46 | (2010.01) |
| H01L 33/44 | (2010.01) |
| F21V 8/00 | (2006.01) |

(52) U.S. Cl.
CPC .......... *H01L 51/5271* (2013.01); *H01L 33/44* (2013.01); *H01L 33/46* (2013.01); *H01L 33/483* (2013.01); *H01L 33/486* (2013.01); *H01L 51/5268* (2013.01); *H01L 51/5275* (2013.01); *G02B 6/0006* (2013.01); *G02B 6/0008* (2013.01)

(58) Field of Classification Search
None
See application file for complete search history.

(56) References Cited

U.S. PATENT DOCUMENTS

| 2015/0171372 A1* | 6/2015 | Iwata ....................... C09D 5/22 |
|---|---|---|
| | | 257/40 |
| 2016/0027966 A1* | 1/2016 | Dubrow .................. H01L 33/06 |
| | | 257/13 |

FOREIGN PATENT DOCUMENTS

| JP | 2007-134339 | 5/2007 |
|---|---|---|
| JP | 2009-179698 | 8/2009 |
| JP | 2011-162876 | 8/2011 |
| JP | 2013-136216 | 7/2013 |
| JP | 2014-508385 | 4/2014 |
| WO | 2012/119111 | 9/2012 |

* cited by examiner

*Primary Examiner* — Minh-Loan Tran
(74) *Attorney, Agent, or Firm* — Renner Otto Boisselle & Sklar, LLP

(57) ABSTRACT

A light reflective material of the present disclosure includes a base material having light transmission property; and a porous particle located in the base material, the porous particle comprising a shell defining pores, the base material having a first refractive index, the shell having a second refractive index higher than the first refractive index. A light-emitting device of the present disclosure includes a light emitter that emits light; and a reflective layer that covers a portion of a surface of the light emitter, the reflective layer comprising a base material having light transmission property and a porous particle located in the base material, the porous particle comprising a shell defining pores, the base material having a first refractive index, the shell having a second refractive index higher than the first refractive index.

8 Claims, 15 Drawing Sheets

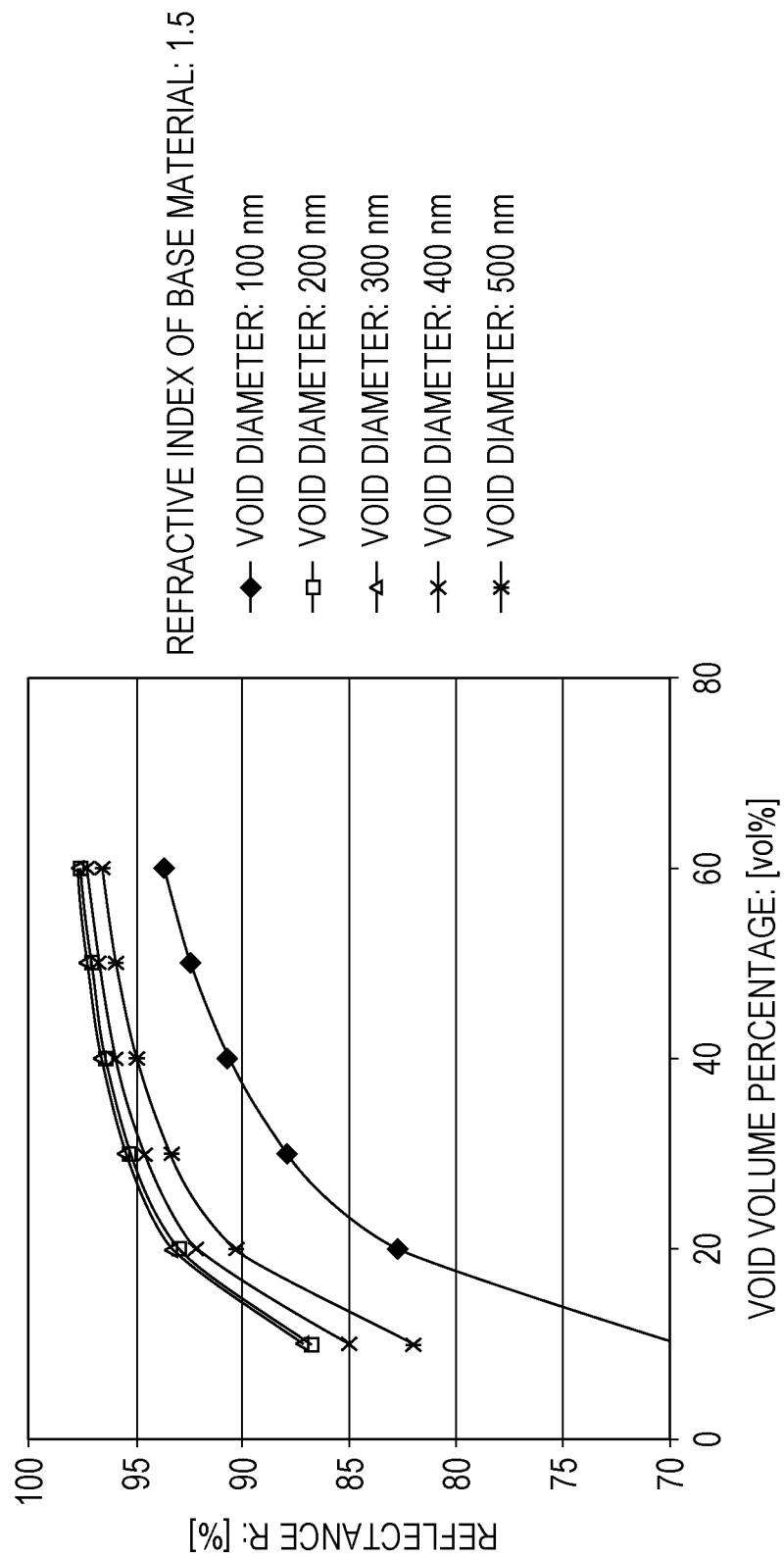

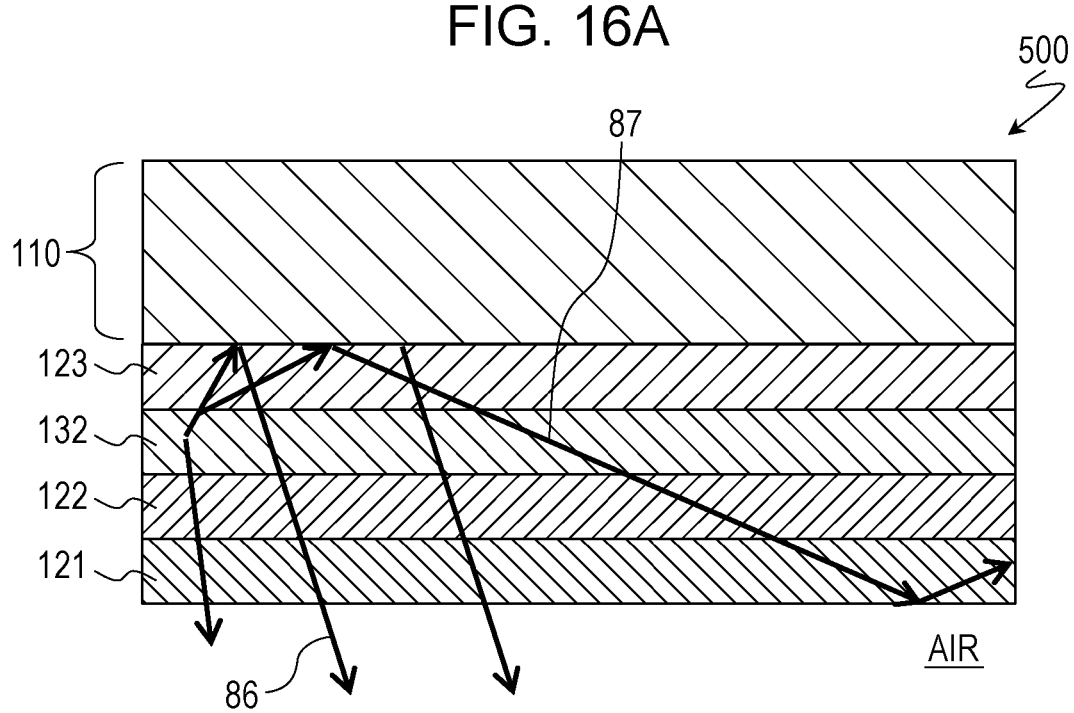
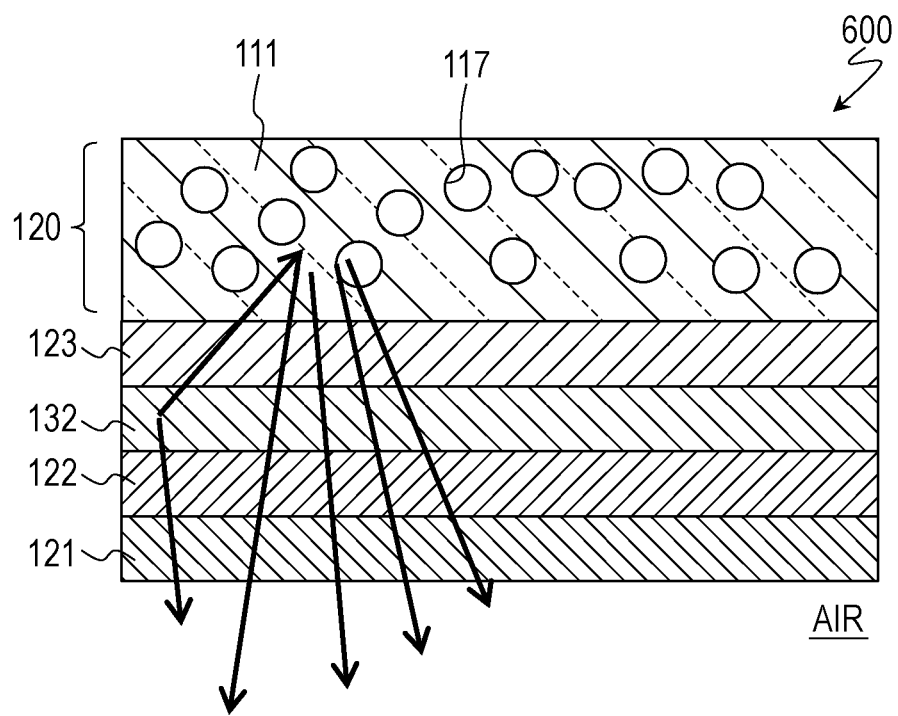

LIGHT REFLECTIVE MATERIAL AND LIGHT-EMITTING DEVICE

BACKGROUND

1. Technical Field

The present disclosure relates to light reflective materials and light-emitting devices including the light reflective materials.

2. Description of the Related Art

Light-emitting devices such as organic electroluminescence devices (hereinafter, written as "organic EL devices") typically include an anode, a cathode and a luminescent layer disposed between the electrodes. In single-side-emission devices, a reflective layer is disposed on the side of the device opposite to the surface through which light is extracted.

The reflective layers are typically layers made of metal materials such as silver (Ag) (hereinafter, written as "metallic reflective layers") (for example, Japanese Patent No. 5533545).

SUMMARY

Improvements in the reflective characteristics of the reflective layers are desired in order to enhance the light extraction efficiency of the light-emitting devices.

One non-limiting and exemplary embodiment provides a novel light reflective material having high reflective characteristics. Another non-limiting and exemplary embodiment provides a light-emitting device which includes a reflective layer containing the light reflective material and which can emit light generated in a luminescent layer with high extraction efficiency.

In one general aspect, the techniques disclosed here feature a light reflective material comprising: a base material having light transmission property; and a porous particle located in the base material, the porous particle comprising a shell defining pores, the base material having a first refractive index, the shell having a second refractive index higher than the first refractive index.

It should be noted that general or specific embodiments may be implemented as an element, a device, a system, an integrated circuit, a method, or any selective combination thereof.

Additional benefits and advantages of the disclosed embodiments will become apparent from the specification and drawings. The benefits and/or advantages may be individually obtained by the various embodiments and features disclosed in the specification and drawings, which need not all be provided in order to obtain one or more of such benefits and/or advantages.

BRIEF DESCRIPTION OF THE DRAWINGS

FIG. 6 is a diagram illustrating reflective characteristics of the light reflective material of Comparative Example 1;

FIG. 16A is a schematic sectional view illustrating an example of typical light-emitting devices including a metallic reflective layer;

FIG. 16B is a schematic sectional view illustrating an example of a light-emitting device of Reference Example including a reflective layer that is a resin layer containing a large number of pores.

DETAILED DESCRIPTION

Figure 1:
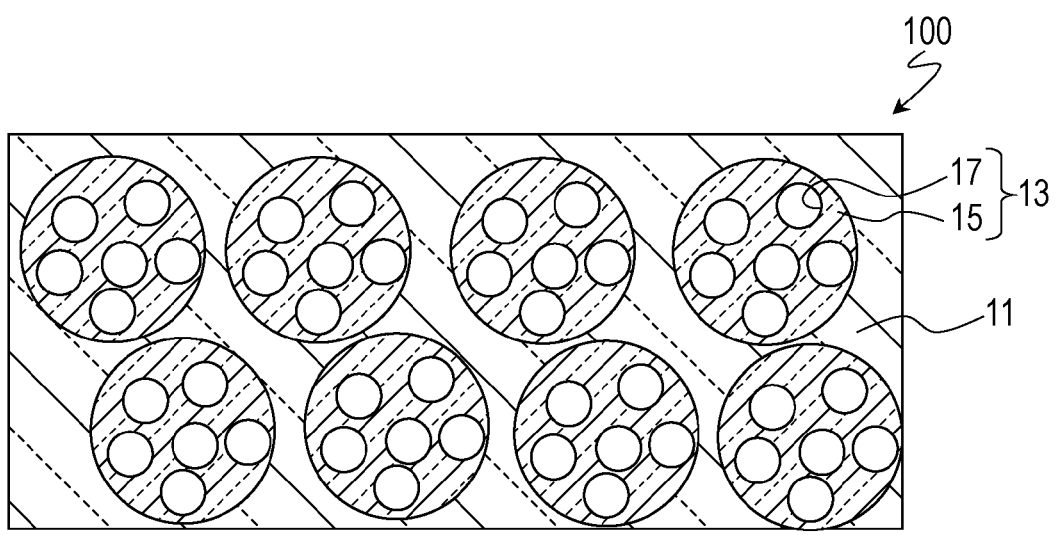
FIG. 1 is a schematic sectional view illustrating an example of a light reflective material according to a first embodiment.

Underlying Knowledge Forming Basis of the Present Disclosure

Layers made of metal materials such as silver (Ag) are typically used as reflective layers. However, the reflectance of Ag reflective layers with respect to visible light is approximately 95% in the air and is decreased to about 90% when the layer is connected to organic layers. This fact makes it difficult to achieve sufficiently high light extraction efficiency. The "light extraction efficiency" of a light-emitting device indicates how much of the light generated in the luminescent layer is released to the atmosphere through the light extraction surface of the light-emitting device.

Underlying knowledge that forms the basis of the present disclosure will be described.

The present inventor carried out extensive studies of structures and materials of reflective layers that would achieve higher reflective characteristics than metallic reflective layers. During the course of the studies, the present inventor studied reflective layers formed of a light transmissive base material, for example an acrylic resin, which contains a large number of pores. As a result, the present inventor found the knowledge described below.

FIG. 16A is a schematic sectional view illustrating a light-emitting device 500 including a metallic reflective layer 110. FIG. 16B is a schematic sectional view illustrating a light-emitting device 600 including a reflective layer 120 that is a resin layer containing a large number of pores.

The light-emitting device 500 includes a substrate 121, and a lower electrode layer 122, a luminescent layer 132, an upper electrode layer 123 and the metallic reflective layer 110 sequentially disposed on the substrate 121. For example, the luminescent layer 132 includes an organic EL material. The upper electrode layer 123 and the lower electrode layer 122 are both transparent conductive layers made of, for example, indium-tin oxide (ITO). The light-emitting device 500 is a single-side-emission device which emits light generated in the luminescent layer 132 through the substrate 121 side.

In the light-emitting device 600, the reflective layer 120 includes a base material 111 made of a resin and a plurality of pores 117 disposed in the resin. The other structure of the device is the same as the light-emitting device 500. For example, the reflective layer 120 may be formed by mixing a foaming agent with the base material 111 followed by a foaming treatment such as heating.

In the light-emitting device 500, there is a risk that a decrease in light extraction efficiency may be caused by, for example, the occurrence of waveguided light and the absorption of light. In the light-emitting device 500, as illustrated in FIG. 16A, a major proportion of light emitted from the luminescent layer 132 and incident on the metallic reflective layer 110 is mirror-reflected while a minor proportion of the light is absorbed. Part 86 of the light mirror-reflected by the metallic reflective layer 110 is extracted out of the device through the substrate 121 side. Other part 87 of the mirror-reflected light is incident onto the interface between the substrate 121 and the air (this interface is sometimes written as the lower surface of the substrate 121) at an angle equal to or greater than the critical angle, and consequently the light is totally reflected. This results in the occurrence of a component waveguided between the metallic reflective layer 110 and the lower surface of the substrate 121. Such a waveguided component is also referred to as waveguided light. The waveguided light is not extracted out of the light-emitting device 500, causing a decrease in light extraction efficiency. Part of the waveguided light is absorbed by, for example, the metallic reflective layer 110, the electrode layers 122 and 123, and organic layers.

In the light-emitting device 600, as illustrated in FIG. 16B, light emitted from the luminescent layer 132 and incident onto the reflective layer 120 is diffusively reflected and scattered by the reflective layer 120. That is, the light incident on the reflective layer 120 is reflected and scattered in various directions. Consequently, even when the light is totally reflected by the lower surface of the substrate 121 and is incident onto the reflective layer 120, only a few components will be reflected and scattered at such an angle that their incident angle with respect to the lower surface of the substrate 121 will be equal to or greater than the critical angle. As a result, no waveguided light is formed. In this manner, the use of the reflective layer 120 having the pores 117 makes it possible to suppress the occurrence of waveguided light. Thus, the light-emitting device 600 including the reflective layer 120 may achieve a higher light extraction efficiency than obtained with the light-emitting device 500 having the metallic reflective layer 110.

The present inventor further carried out studies on the reflective layer 120 having the pores 117, and found that the reflectance of the reflective layer 120 was largely dependent on the size of the pores 117. That is, a variation in the size of the pores 117 may hinder high reflectance. Since it is difficult to form pores 117 with a uniform size in a base material 111, great difficulties will be encountered in suppressing a decrease in reflectance ascribed to the size variation of the pores 117. In the specification, the term "reflectance" indicates the ratio of the amount of light reflected by a reflective layer relative to the amount of light incident on the surface of the reflective layer. This ratio is generally also called total light reflectance. The light reflected by a reflective layer includes diffusively reflected light.

The studies by the present inventor have further found that the reflectance may be further enhanced by increasing the volume percentage of the pores 117 in the reflective layer 120. However, the formation of pores 117 in a base material 111 by the conventional method encounters difficulties in increasing the volume percentage of the pores 117 to a sufficient level.

Another possible approach to introducing pores in the inside of a base material is to mix the base material with hollow particles having a single pore. However, the studies by the present inventor have found that increasing the pore volume percentage to a sufficient level is difficult even with the use of hollow particles.

In the course of additional studies dealing with such difficulties, the present inventor has found that the problems discussed above may be solved by using porous particles which have shells containing a plurality of pores in the shell and having a higher refractive index than that of a base material.

First Embodiment

Hereinbelow, light reflective materials according to the first embodiment will be described.

FIG. 1 is a schematic sectional view illustrating a light reflective material 100 of the present embodiment.

The light reflective material 100 includes a base material 11 and a plurality of porous particles 13.

The base material 11 is a light transmissive, organic or inorganic substance. That is, the base material 11 has light transmission property. As used herein, the term "light transmissive" means that the material can transmit light that is to be reflected by the light reflective material 100 (hereinafter, this light is written as the "first light"). For example, the first light may be light having a specific wavelength. For example, the first light may be visible light.

Each of the porous particles 13 includes a plurality of pores 17 and a shell 15 which defines the plurality of pores 17. The shells 15 have a refractive index higher than the refractive index of the base material 11. The refractive index of the pores 17 is, for example, 1.0. In the specification, the terms "refractive index", "transmittance" and "reflectance" refer to the refractive index, the transmittance and the reflectance with respect to the first light.

The light reflective material 100 of the present embodiment may form a reflective layer that is free from the absorption of light by metals and can suppress the surface plasmon loss and the occurrence of waveguided light. As a result, the reflective layer exhibits higher reflective characteristics than metallic reflective layers. Further, the reflective characteristics may be enhanced as compared to those of the reflective layer in Reference Example illustrated in FIG. 16B. The reasons for these advantages will be described in detail below.

As mentioned hereinabove with reference to FIG. 16B, the reflective layer 120 including the base material 111 and the simple pores 117 has a large dependence of reflectance on the size of the pores 117. Because of this fact, the reflectance may be decreased due to a variation in the size of the pores 117. In contrast, the light reflective material of the present embodiment involves shells 15 having a higher refractive index than that of the base material 11. This configuration increases the difference in refractive index between the pores 17 and their surrounding (the shells 15) to enhance the scattering properties of the pores 17, and hence the obtainable reflective layer achieves a high reflectance. The scattering properties of the pores 17 may be enhanced regardless of the size of the pores, and consequently the variation in reflectance depending on the size of the pores 17 may be reduced. Further, the above configuration allows the volume percentage of the pores 17 to be increased. Thus, a higher reflectance than obtained with metallic reflective layers may be realized by, for example, controlling the refractive indexes of the base material 11 and the shells 15, and the volume percentage of the pores 17. For example, a reflectance exceeding 95% may be realized.

The mean particle diameter of the porous particles 13 is desirably sufficiently larger than the wavelength of the first light and is desirably, for example, 10 μm or more. Here, the "mean particle diameter" is the mean of the particle diameters of the porous particles 13 on a basis of the number of the particles. In the normal distribution, the porous particles 13 have the mean particle diameter in the middle of the distribution. For example, the mean particle diameter may be determined by observation with an electron microscope such as SEM, or may be determined with a grain size distribution analyzer.

When the mean particle diameter of the porous particles 13 is sufficiently larger than the wavelength of the first light, the pores 17 can scatter the light so as to achieve a high reflectance. The mechanism will be described in detail below with reference to the drawings.

Figure 2A:
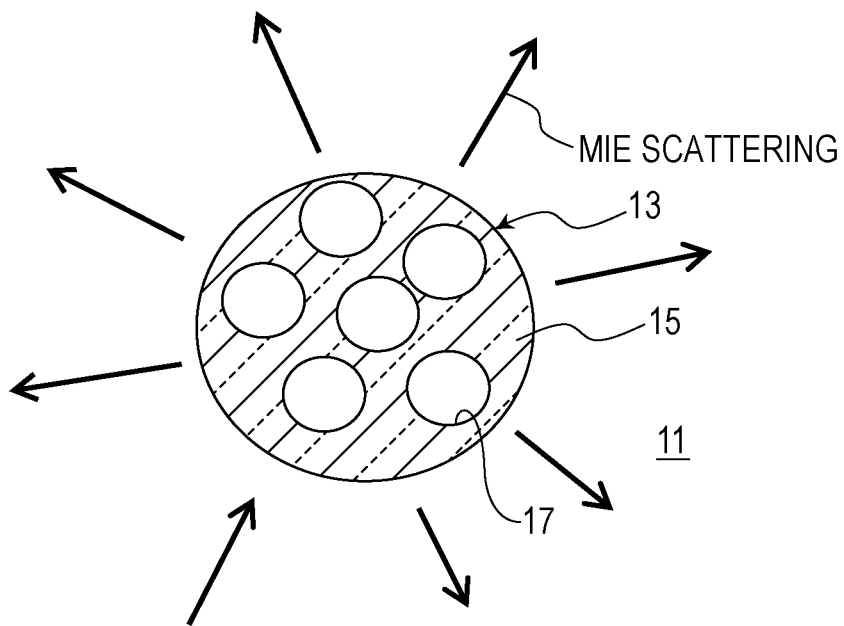
FIG. 2A is a schematic view illustrating the scattering and reflection of light by a shell and pores of a light reflective material.
Figure 2B:
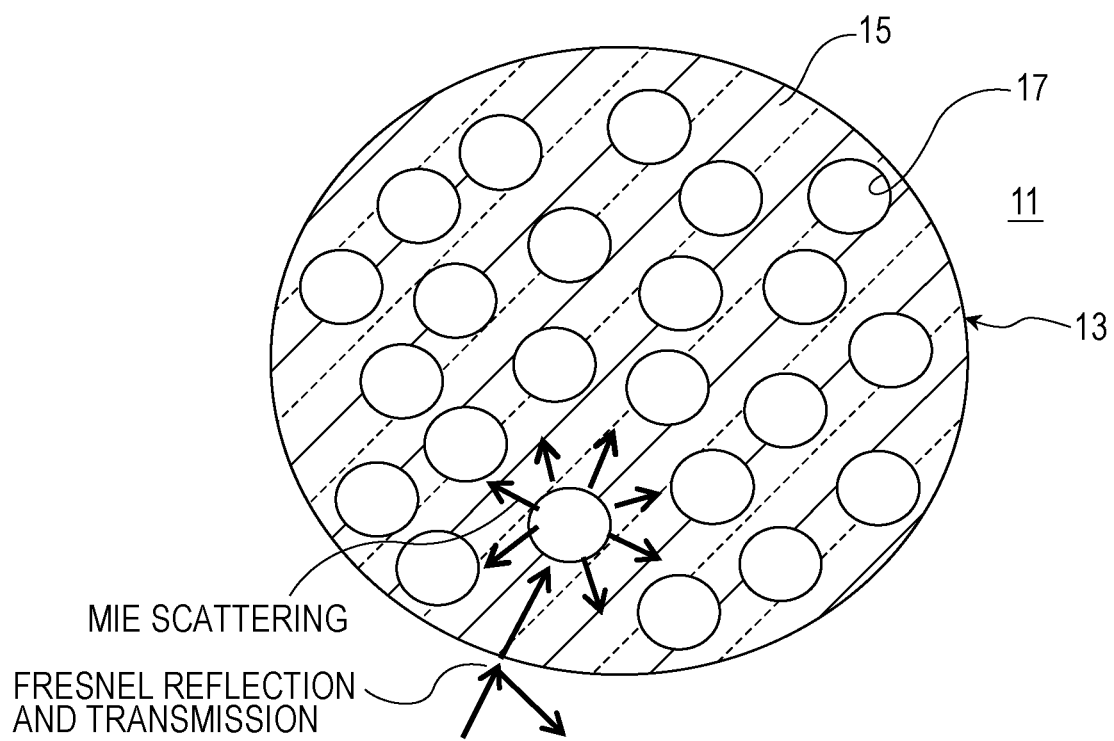
FIG. 2B is a schematic view illustrating the scattering and reflection of light by a shell and pores of a light reflective material.

If the particle diameter of the porous particle 13 is small (for example, less than 10 μm), as illustrated in FIG. 2A, a certain relationship between the particle diameter of the porous particle 13 and the wavelength of the first light may cause the porous particle 13 to behave as a solid homogeneous particle having an arithmetic mean of the refractive index of the shell 15 and the refractive index of the pores 17 based on their volume ratio. When, in contrast, the particle diameter of the porous particle 13 has such a size (for example, a particle diameter of 10 μm or more) that the light does not display a wave nature, the interface between the porous particle 13 and the base material 11 negligibly serves as a scattering particle. As illustrated in FIG. 2B, the first light incident on this interface obeys the Snell's law and the Fresnel theory, and is partly transmitted (enters) to the inside of the porous particle 13 without being scattered inside the particle and is partly reflected by the porous particle 13 without being scattered outside the particle. The light traveling in the porous particle 13 is scattered by the pores 17.

The factors that dominantly determine the scattering characteristics of the porous particles 13 are the size of the pores 17, the refractive index of the pores 17, and the refractive index of the shells 15. Accordingly, the scattering properties of the pores 17 may be enhanced and the reflectance may be increased by controlling the size and the refractive index of the pores 17, and the refractive index of the shells 15.

Further, a higher volume percentage of the pores 17 than heretofore obtained may be achieved by increasing the mean particle diameter of the porous particles 13, resulting in a further enhancement in reflectance. The mechanism will be described in detail below.

As mentioned hereinabove, the reflective layer 120 of Reference Example (FIG. 16B) including the base material 111 and the simple pores 117 has a problem in that increasing the volume percentage of the pores 117 is difficult. A low volume percentage of the pores 117 relative to the base material 111 leads to a failure to obtain a high reflectance.

One of the possible approaches to introducing pores in the inside of a base material is to mix the base material with hollow particles having a single pore inside the particle. The present inventor has simulated the reflection in this case based on the Mie theory to find that a higher reflectance may be obtained when the diameters of the scattering particles (here, hollow particles) mixed in the base material are 100 nm to 300 nm. However, the studies carried out by the present inventor have shown that it is difficult to mix such minute hollow particles in the base material due to the surface resistance of the particles. Thus, even the use of hollow particles cannot overcome the difficulty in increasing the reflectance.

Figure 17:
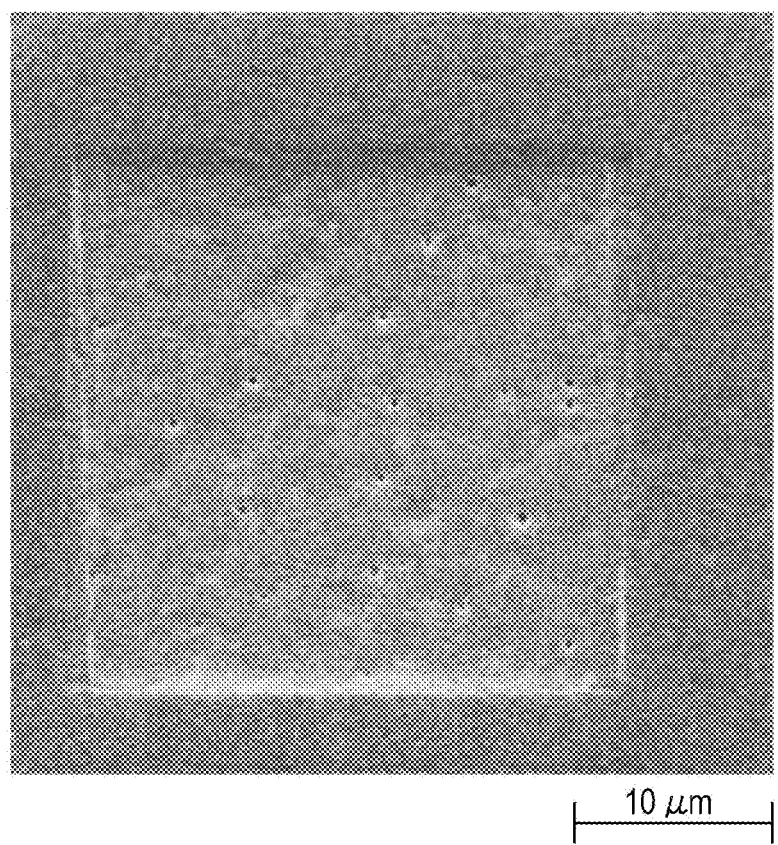
FIG. 17 is an electron micrograph illustrating a cross-section of a light-reflecting material including a base material and hollow silica particles (Reference Example).

As an example of the hollow particles having a diameter in the above range, the present inventor prepared a light-reflecting material using hollow silica particles which had a diameter of 100 nm and a shell thickness of 10 nm (Reference Example). FIG. 17 is an electron micrograph illustrating a cross-section of the light-reflecting material of Reference Example. As evident from FIG. 17, the light-reflecting material of Reference Example has shown that the hollow silica particles hardly achieve a volume percentage of above 10% relative to the base material. This result is probably because the surface resistance of the above hollow silica particles makes it difficult for the particles to be mixed in the base material and also because the shells have so small a thickness that they are easily broken.

The present embodiment overcomes this problem. As mentioned hereinabove with reference to FIG. 2, when the size of the porous particle 13 is sufficiently larger than the wavelength of the first light, the interface between the porous particle 13 and the base material 11 exhibits little nature as a scattering particle. Thus, the scattering characteristics of the porous particle 13 are mainly determined by the size and the refractive index of the pores 17, and the refractive index of the shell 15. The reflective characteristics are not deteriorated even when the size of the porous particle 13 is increased as long as the volume percentage of the pores 17 in the porous particle 13 remains the same. Accordingly, increasing the mean particle diameter of the porous particles 13 (for example, to 10 μm or more) facilitates mixing of the porous particles 13 in the base material 11 without causing a decrease in reflective characteristics. Further, this approach increases the durability of the porous particles 13 and prevents the breakage of the porous particles 13 during the production process. Thus, the volume percentage of the pores 17 may be increased and the reflectance may be enhanced.

Even in the event that the porous particles mixed in the base material 11 are broken into smaller particles during the production process, the scattering by the pores 17 is maintained and the reflective characteristics are not deteriorated as long as the size of the broken particles (porous particles) is, for example, 10 µm or more.

The mean particle diameter of the porous particles 13 may be 1000 µm or less. This configuration restrains an increase in the thickness of the reflective layer.

The volume percentage Va of the pores 17 to the base material 11 may be 20% or more. As will be illustrated later in Examples 2A and 2B and Comparative Example 1 (FIGS. 6 to 8), the reflectance of a reflective layer 10 may be increased more effectively when the volume percentage Va of the pores 17 is 20% or more. Further, this configuration makes it possible to reduce more effectively the decrease in reflectance due to a variation in the size of the pores 17. For example, the "volume percentage Va of the pores 17" may be determined by Vb×e wherein Vb is the volume percentage of the porous particles 13 to the base material 11 and e is the mean porosity of the porous particles 13 (the ratio of the volume of the pores 17 to the volume of the porous particles 13).

The structure of the light reflective material 100 of the present embodiment is not limited to the one illustrated in FIG. 1. The base material 11 may contain a plurality of types of porous particles 13 made of different materials. Further, the base material 11 may contain additional elements such as particles other than the porous particles 13, holes and hollow particles in addition to the porous particles 13.

<Description of Constituent Elements>
[Base Material 11]

The base material 11 may be an organic substance. Examples of the organic substances include resin compounds such as acrylic resin compounds, epoxy resin compounds, silicone resin compounds and fluororesin compounds. Further, sulfur-modified resin compounds such as thiophene resin compounds may be used. The base material 11 may be an inorganic substance. Examples of the inorganic substances include water glass. For example, the refractive index of the base material 11 is 1.45 to 1.80, although not particularly limited thereto.

The base material 11 may be composed of more than one material. For example, the base material 11 may be a mixture of a matrix with a filler having a higher refractive index than the matrix. In this case, the base material 11 exhibits a higher refractive index than the matrix. In the reflective layer 10 having this structure, the refractive index of the base material 11 may be controlled by, for example, adjusting the volume percentage of the filler. In this manner, light from the luminescent layer may be incorporated into the reflective layer 10 more efficiently and consequently the light extraction efficiency may be further enhanced.

The refractive index of the base material 11 including a matrix and a filler may be determined using the following equation:

Refractive index of base material 11=(Volume percentage of matrix to base material 11)×(Refractive index of matrix)+(Volume percentage of filler to base material 11)×(Refractive index of filler)

The filler desirably has such a size that visible light is not scattered. For example, the mean particle diameter of the filler may be 0.005 µm to 0.05 µm. Examples of the fillers include $TiO_2$ (refractive index: 2.1), $ZrO_2$ (refractive index: 2.5), ITO (refractive index: 2.0), ATO (refractive index: 2.0), ZnO (refractive index: 2.0), $CeO_2$ (refractive index: 2.2) and CdO (refractive index: 2.5). The matrix of the base material 11 may be one having a high refractive index, with examples including fluorene resin compounds and naphthalene resin compounds. The volume percentage of the filler to the matrix may be controlled appropriately so that the base material 11 has a desired refractive index.

[Porous Particles 13]

Examples of the porous particles 13 include porous silica particles, porous acrylic particles, mesoporous silica particles, porous $TiO_2$ particles and porous $ZrO_2$ particles.

The porosity of the porous particles 13 (the ratio of the volume of the pores 17 to the volume of the porous particles 13) is not particularly limited. To ensure the desired volume percentage Va of the pores 17 to the base material 11, the porosity of the porous particles 13 may be, for example, 30% or more, and more desirably 50% or more. With this pore content, the volume percentage Va of the pores 17 may be further increased. To ensure the durability of the porous particles 13, the porosity of the porous particles 13 may be 80% or less.

The shapes of the porous particles 13 are not limited to spheres. For example, the particles may have random shapes obtained by crushing. The porous particles 13 present in the base material 11 may have various shapes, sizes and pore contents differing from one another.

The shells 15 have a refractive index higher than the refractive index of the base material 11. By virtue of the shells 15 having a high refractive index (for example, 1.6 or above), the difference in refractive index at the interfaces between the shell 15 and the pores 17 may be increased to make it possible to increase the reflectance more effectively.

The size (mean particle diameter) of the pores 17 is not particularly limited. For example, the size may be 100 nm to 300 nm. Based on the simulation results described hereinabove, the reflective characteristics may be enhanced more effectively when the pores 17 serving as scattering particles have a size in the above range. The sizes and the shapes of the pores 17 may be nonuniform. While the drawings illustrate the pores 17 as being completely enclosed in the shells 15, the enclosure in the shells 15 may be incomplete. That is, for example, portions of the pores 17 may be in contact with the base material 11.

<Process for Producing Light Reflective Material 100>

Next, an example of the processes for producing the light reflective material 100 will be described.

Figure 3A:
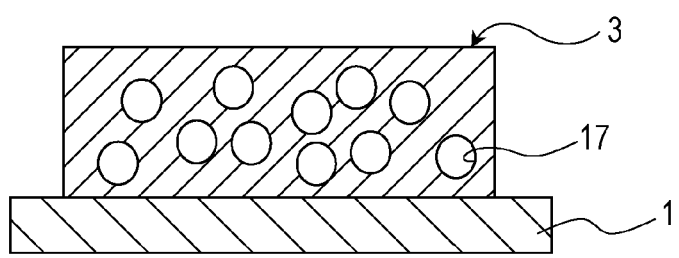
FIG. 3A is a schematic sectional view illustrating a step in a process for producing the light reflective material.

First, as illustrated in FIG. 3A, a porous film 3 is formed on a substrate 1. The porous film 3 includes a plurality of pores 17. The diameter of the pores 17 is, for example, 100 to 300 nm. The porous film 3 may be formed by any method without limitation.

Figure 3B:
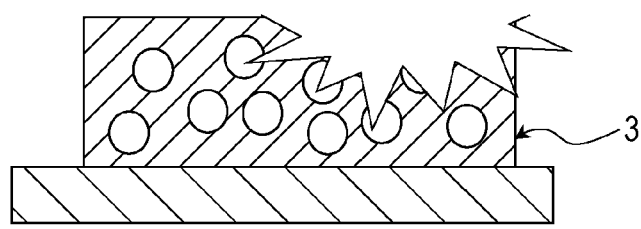
FIG. 3B is a schematic sectional view illustrating a step in a process for producing the light reflective material.

Next, as illustrated in FIG. 3B, the porous film 3 is crushed into particles. The crushing results in porous particles 13 illustrated in FIG. 3C which include a shell 15 and a plurality of pores 17. The shape of the particles 13 is not particularly limited. The porous particles 13 may have a shape other than spherical shapes.

Figure 3C:
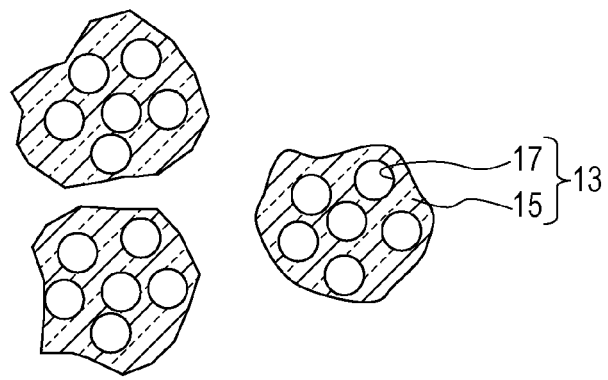
FIG. 3C is a schematic sectional view illustrating a step in a process for producing the light reflective material.
Figure 3D:
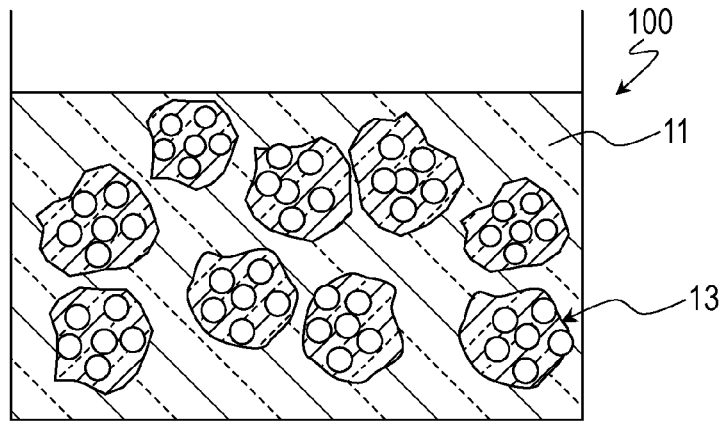
FIG. 3D is a schematic sectional view illustrating a step in a process for producing the light reflective material.

Thereafter, as illustrated in FIG. 3D, the porous particles 13 and a base material 11 are kneaded. For example, the base material 11 is an acrylic resin. The base material 11 may be any other resin. In the manner described above, a light reflective material 100 is produced.

The process for producing the light reflective material 100 is not limited to the one described above. For example, the light reflective material 100 may be obtained by mixing commercial acrylic porous particles (for example, ADVANCELL HB manufactured by SEKISUI CHEMICAL CO., LTD.) into a base material 11.

Example 1

A light reflective material of Example 1 was prepared by a process described in detail below.

First, a mixture was obtained by stirring together an aqueous dispersion of 2.3 g of a high-purity $TiO_2$ powder with an mean primary particle diameter of 20 nm (solid concentration: 20 wt %), 7.7 g of ethanol, 1.9 g of water-insoluble polymer particles with an mean particle diameter of 0.3 μm (FS-104E manufactured by NIPPON PAINT CO., LTD.), and 0.45 g of a surfactant (F127 manufactured by Sigma-Aldrich). The mixture was ultrasonicated to give a uniform dispersion for the formation of a porous $TiO_2$ thin film.

The $TiO_2$ dispersion prepared above was applied onto a glass substrate by spin coating (500 rpm, 20 seconds). After the spin coating, the $TiO_2$ dispersion on the glass substrate was dried. Next, the dry film was calcined at 500° C. in the air for 1 hour. By the calcination, the water-insoluble polymer particles were vaporized to form pores 17. In this manner, a porous $TiO_2$ thin film having a plurality of pores 17 was obtained (see FIG. 3A).

Figure 4:
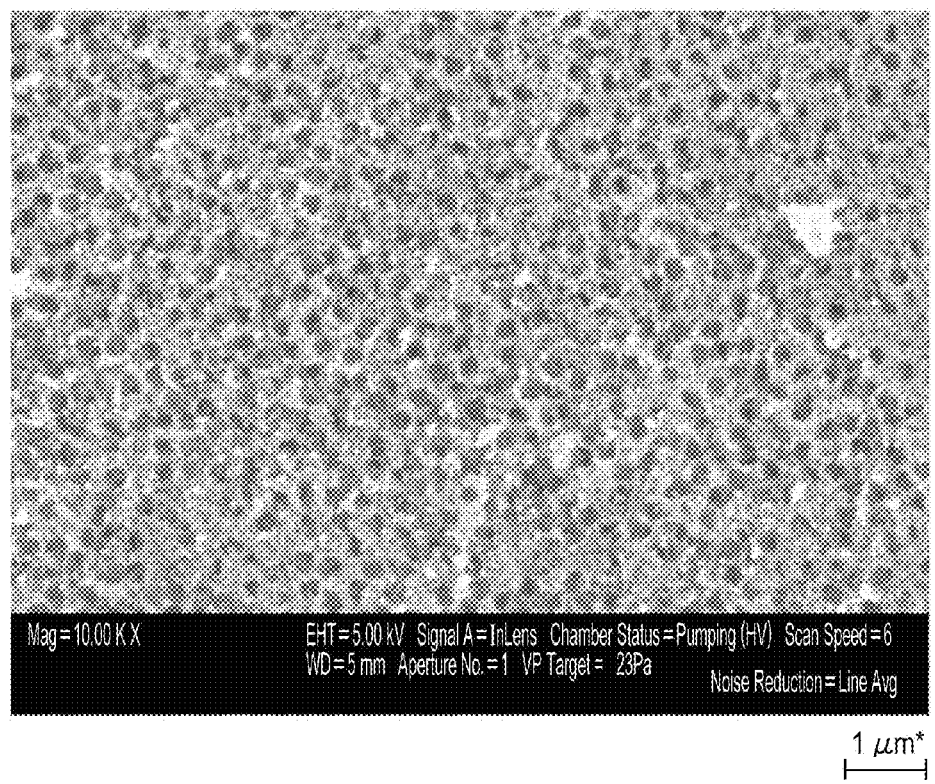
FIG. 4 is an electron micrograph illustrating a cross-section of a porous film used in the preparation of a light reflective material in Example 1.

An electron micrograph of a cross-section of the porous $TiO_2$ thin film obtained is shown in FIG. 4. As shown in FIG. 4, the layer formed of $TiO_2$ nanoparticles contained pores 17 formed by the vaporization of the water-insoluble 0.3 μm spherical polymer particles.

Thereafter, the porous $TiO_2$ thin film on the glass substrate was scraped to give porous particles 13 having $TiO_2$ (refractive index: 2.5) as shells (see FIGS. 3B and 3C).

Subsequently, the porous particles 13 and an acrylic resin were kneaded. A light reflective material 100 of Example 1 was thus obtained (see FIG. 3D).

Example 2 and Comparative Example 1

By simulation, the relationship between the size and volume percentage Va of pores, and the reflectance was studied. The simulation method and the results will be described below.

Simulation Models

Figure 5A:
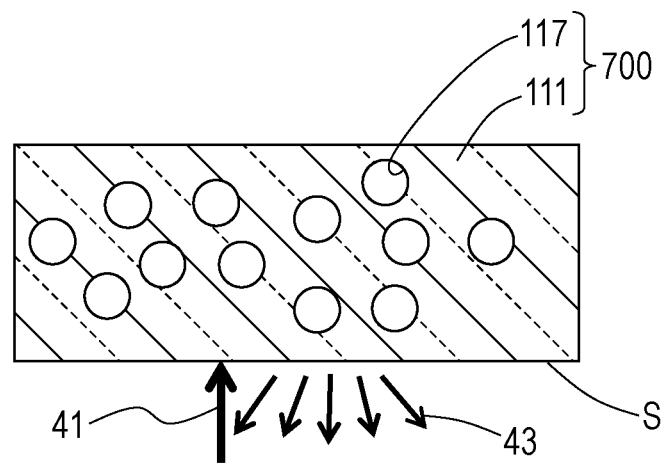
FIG. 5A is a view illustrating a simulation model used to study the relationship between the pore diameter and the pore volume percentage, and the reflectance of a reflective layer containing a light reflective material of Comparative Example 1.
Figure 5B:
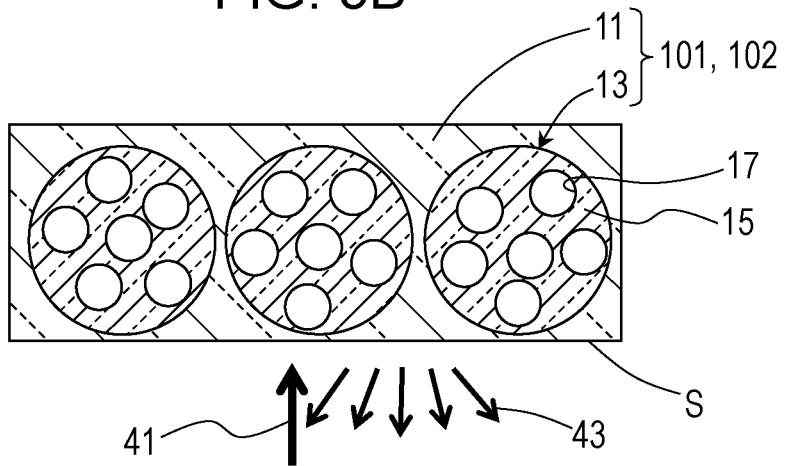
FIG. 5B is a view illustrating a simulation model used to study the relationship between the pore diameter and the pore volume percentage, and the reflectance of a reflective layer containing a light reflective material of Example 2A or 2B.

FIG. 5 illustrates simulation models. FIG. 5A is a schematic enlarged sectional view illustrating a reflective layer formed of a light reflective material 700 of Comparative Example 1. FIG. 5B is a schematic enlarged sectional view illustrating a reflective layer formed of a light reflective material 101 or 102 of Example 2A or 2B.

The light reflective material 700 of Comparative Example 1 has a structure in which a plurality of pores (refractive index: 1.0) 117 are disposed in a base material 111. The base material 111 is an acrylic resin (refractive index: 1.5).

The light reflective material 101 of Example 2A has a structure in which a plurality of shells (refractive index: 1.7) 15 are disposed in a base material 11. The shells 15 include a plurality of pores (refractive index: 1.0) 17 in the shell. The base material 11 is an acrylic resin (refractive index: 1.5).

The structure of the light reflective material 102 of Example 2B is the same as the light reflective material 101 of Example 2A, except that the refractive index of the shells is 2.5.

Simulation Method

The behavior of light scattered by scattering particles may be analyzed based on the Mie theory. In Example 2 and Comparative Example 1, the mean free path of light between scattering particles was determined based on the Mie theory, and the reflectance of the reflective layer was obtained by a stochastic ray-tracing method. The mean free path of light between scattering particles is obtained as a reciprocal of the product of the number density of the scattering particles relative to the base material, multiplied by the scattering cross-sectional area of the scattering particles. The scattering particles are the pores 17 in Example 2, and are the pores 117 in Comparative Example 1.

While changing the diameter of the pores 117 in the light reflective material 700 in the range of 100 nm to 500 nm, the relationship between the volume percentage of the pores (refractive index: 1.0) 117 relative to the base material 111, and the reflectance R was studied. The reflectance R was determined by causing light 41 to be vertically incident onto the surface S of the reflective layer, and measuring the ratio of light 43 reflected in the reflective layer and emitted through the surface S, relative to the light 41. Similarly, the relationship between the volume percentage of the pores 17 to the base material 11, and the reflectance R was studied with respect to the light reflective materials 101 and 102 while changing the diameter of the pores 17 in the range of 100 nm to 500 nm.

The simulation assumed that the wavelength of the light 41 and 43 was 625 nm and the thickness of the reflective layer was 0.1 mm.

Simulation Results

Figure 7:
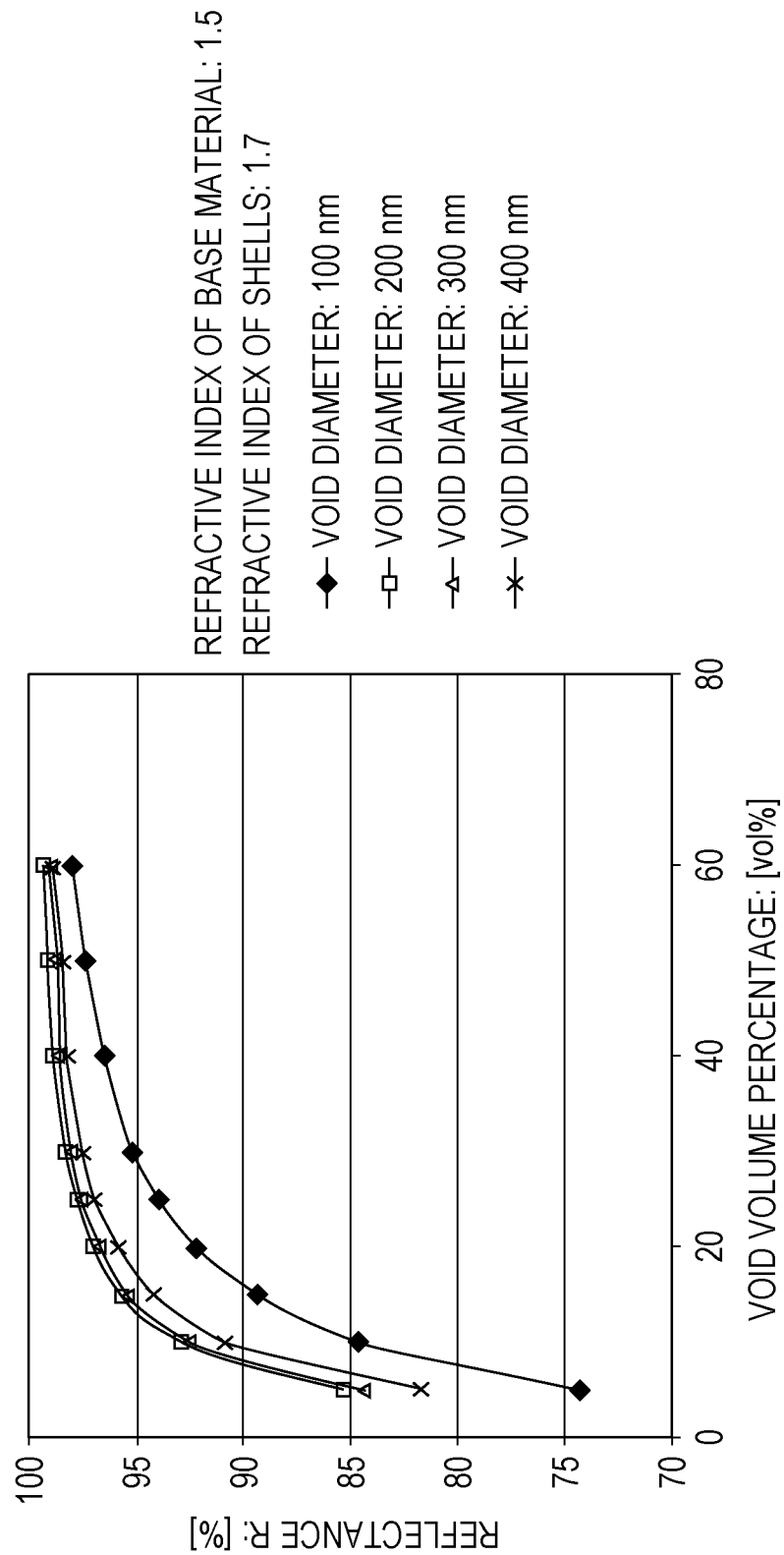
FIG. 7 is a diagram illustrating reflective characteristics of the light reflective material of Example 2A.
Figure 8:
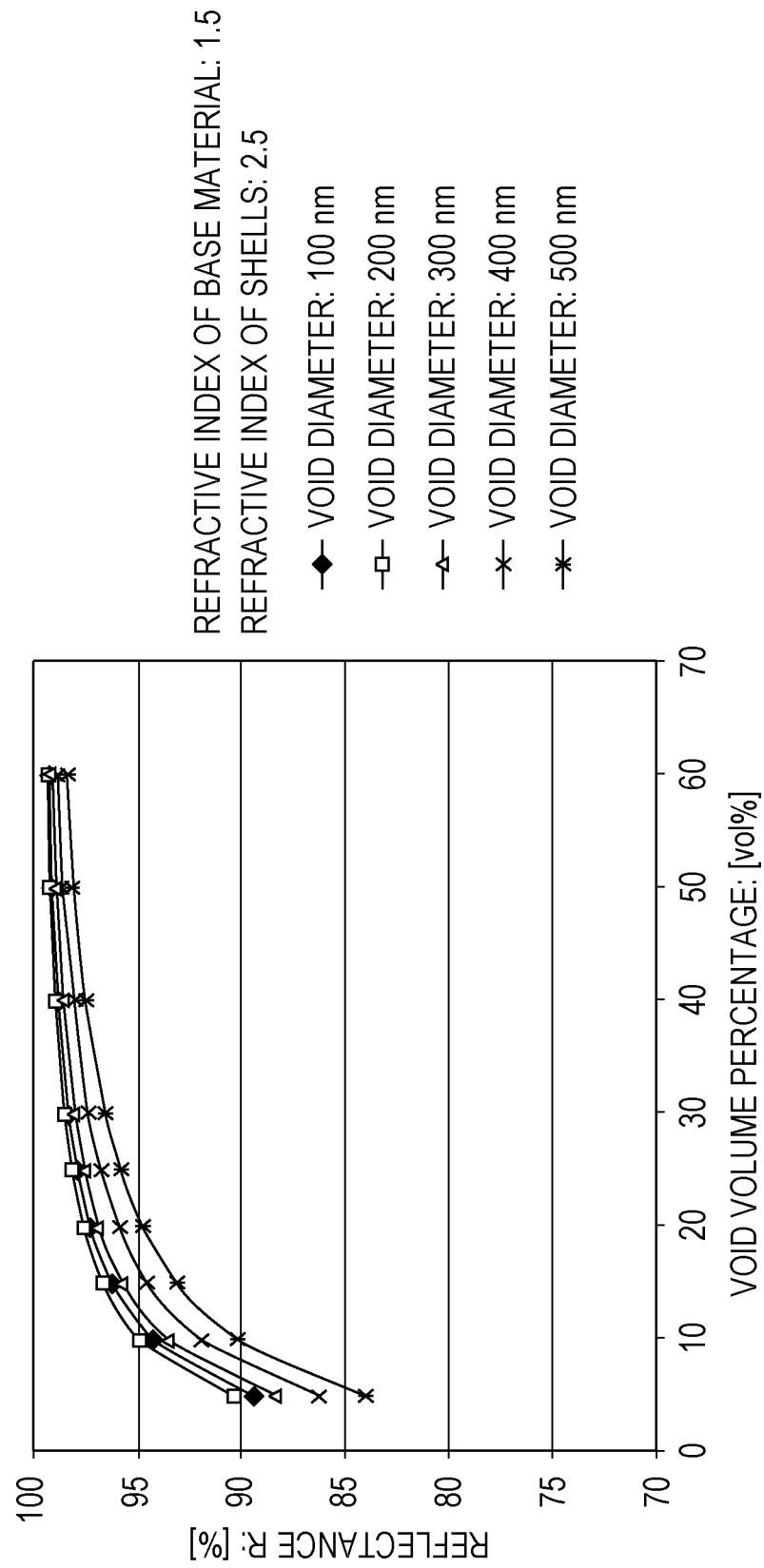
FIG. 8 is a diagram illustrating reflective characteristics of the light reflective material of Example 2B.

The simulation results are shown in FIGS. 6 to 8. FIG. 6 is a diagram illustrating the reflective characteristics of the reflective layer which included the light reflective material 700 of Comparative Example 1. FIGS. 7 and 8 are diagrams illustrating the reflective characteristics of the reflective layers which included the light reflective materials 101 and 102 of Examples 2A and 2B, respectively.

The results show that the reflectance R was enhanced by increasing the volume percentage of the pores 17 or 117 in all the cases of the light reflective materials.

However, as illustrated in FIG. 6, the reflective layer which included the light reflective material 700 of Comparative Example 1 showed widely different values of the reflectance R depending on the size of the pores 117. Accordingly, the presence of a variation in the size of the pores 117 will cause a variation in the reflectance R. When, for example, the volume percentage of the pores 117 is 20%, a variation in the size of the pores 117 in the range of 100 nm to 300 nm causes as large a variation in the reflectance R as about 10%.

As already mentioned hereinabove, it is difficult to control the size of the pores 117 to a uniform size in the actual production of the pores 117 in the base material 111. Thus, the use of the light reflective material 700 may lead to a failure to obtain a high reflectance R.

In contrast, as illustrated in FIGS. 7 and 8, the reflective layers which included the light reflective materials 101 and 102 of Examples 2A and 2B achieved a higher reflectance R than obtained in Comparative Example 1 and also achieved a reduction in the variation in the reflectance R by the size variation of the pores 17, by virtue of the use of the shells 15. The reasons for these results are described below.

As mentioned hereinabove, the interface between the porous particle 13 and the base material 11 in the light reflective materials 101 and 102 of Examples 2A and 2B exhibits little characteristics as a scattering particle. Thus, the scattering characteristics of the porous particles 13 are mainly determined by the size of the pores 17 and the difference in refractive index between the pores 17 and the shells 15. The differences in refractive index between the pores 17 and the shells 15 in Examples 2A and 2B were larger than the difference in refractive index between the pores 117 and the base material 111 in Comparative Example 1. Probably because of this, the pores 17 in Examples 2A and 2B achieved higher scattering efficiency than the pores 117 in Comparative Example 1 and the reflectance R was enhanced as a result. Further, the enhanced efficiency in the scattering by the pores probably reduces the variation in the reflectance R depending on the size of the pores. For example, reference is made to FIG. 7. When the volume percentage of the pores 17 is 20%, the reflective layer including the light reflective material 101 achieves less than 5% variation in the reflectance R even when the pores 17 have sizes varied in the range of 100 nm to 300 nm.

Further, the reflective layer which included the light reflective material 102 exhibited a higher reflectance R and a smaller variation in the reflectance R depending on the size variation of the pores 17 as compared to the reflective layer including the light reflective material 101. For example, as shown in FIG. 8, the reflective layer including the light reflective material 102 exhibited substantially equal reflectances R when the diameter of the pores 17 was 100 nm and when the diameter of the pores 17 was 300 nm in all the range of the volume percentage of the pores 17. This result shows that increasing the refractive index of the shells 15 expands the difference in refractive index between the pores 17 and the shells 15, and consequently the reflectance R may be further enhanced and the variation in the reflectance R may be further reduced.

The light reflective material 102 achieved a marked improvement in the reflectance R particularly when the diameter of the pores 17 was 100 nm. The factors responsible for this will be described below. As mentioned hereinabove, the Mie theory states that the mean free path of light between scattering particles is determined as a reciprocal of the product of the number density of the scattering particles relative to the base material, multiplied by the scattering cross-sectional area of the scattering particles. In general, the mean free path of light between scattering particles is increased exponentially when the diameter of the scattering particles falls below a threshold size. This phenomenon occurs because the reduction in the scattering cross-sectional area of the scattering particles due to the reduction in the diameter of the scattering particles becomes dominant over the increase in the number density of the scattering particles relative to the base material. The exponential increase in the mean free path of light between scattering particles causes a drastic decrease in the reflectance.

In Examples 2A and 2B, the difference in refractive index between the scattering particles (the pores 17) and the surrounding material (the shells 15) was relatively larger than in Comparative Example 1, and hence the scattering cross-sectional area was relatively larger than in Comparative Example 1. As a result, the range of the scattering particle diameters which would cause an exponential increase in the mean free path of light was shifted to the smaller diameter side. This is probably the reason why a marked improvement in the reflectance R was obtained when the diameter of the pores 17 was 100 nm.

Further, the light reflective materials 101 and 102 were demonstrated to exhibit a higher reflectance R and to have a smaller variation in the reflectance R depending on the size of the pores 17, with increasing volume percentage of the pores 17. This result is probably because the increase in the volume percentage of the pores 17 increases the degree by which the scattering by the pores 17 contributes to the reflectance. Examples 2A and 2B resulted in a high reflectance regardless of the refractive index of the shells 15. For example, a reflectance of 95% or above was realized when the volume percentage of the pores 17 was 20% or above, although variable depending on the size of the pores 17. When the volume percentage of the pores 17 was 40% or above, a high reflectance of 95% or above may be realized even when the pores 17 have sizes varied in the range of 100 to 500 nm. When the volume percentage of the pores 17 is 50% or above, the reflectance may be increased to, for example, about 98% regardless of the refractive index of the shells 15 and the size of the pores 17.

Example 3 and Comparative Example 2

In Example 3, reflective layers were prepared using a light reflective material containing porous particles. In Comparative Example 2, reflective layers were prepared using a light reflective material containing hollow particles. The reflective characteristics of these reflective layers were measured and compared with analytical values.

Preparation of Reflective Layers

In Example 3, three types of reflective layers having thicknesses of 1 mm, 3 mm and 5 mm were prepared by mixing porous particles in a resin material. The plane shape of the reflective layers was a 40 mm×40 mm square. Here, acrylic porous particles (manufactured by SEKISUI CHEMICAL CO., LTD.) and an acrylic resin (refractive index: 1.59) as the base material were kneaded. The mean diameter of the porous particles was 20 µm. The volume percentage of the pores in the acrylic porous particles was about 50 vol %.

In the kneading process, the volume percentage of the acrylic porous particles relative to the base material was 54 vol %. As a result, the volume percentage of the pores to the base material was about 27 vol %.

In Comparative Example 2, reflective layers having thicknesses of 1 mm and 5 mm were prepared by kneading hollow silica particles and an acrylic resin (refractive index: 1.59) as the base material. The plane shape of the reflective layers was a 40 mm×40 mm square. The mean diameter of the hollow silica particles was 0.1 µm. In the kneading process, the scheduled amount of the hollow silica particles was such that the volume percentage of the pores to the base material would be 27 vol %. However, the volume percentage reached only about 10 vol % because the kneading was inhibited by the surface resistance of the hollow silica particles.

Results of Measurement of Reflectance R

Figure 9:
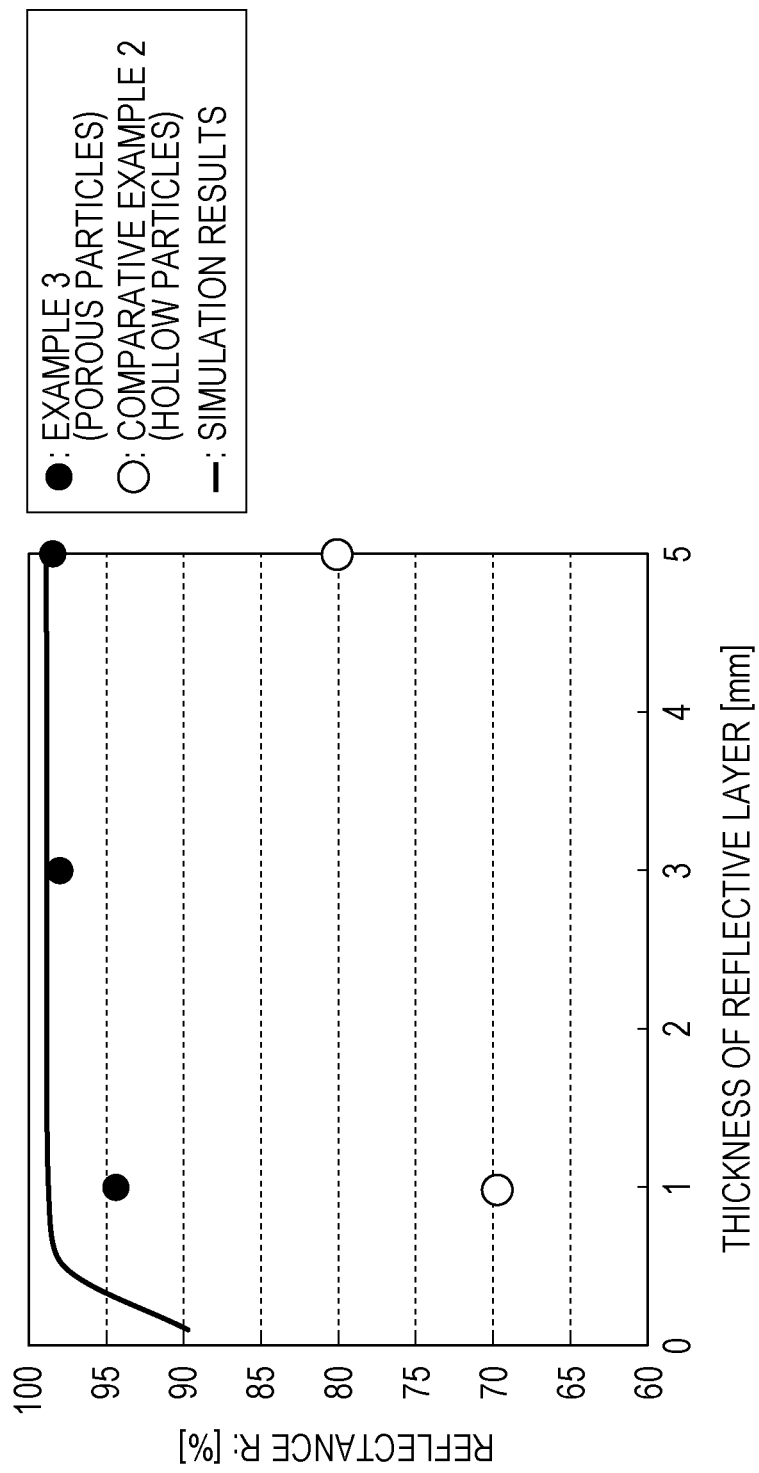
FIG. 9 is a diagram illustrating measurement results of the reflectance of a reflective layer containing a light reflective material of Example 3 and that of Comparative Example 2, as well as simulation results.

The reflectance R of the reflective layers of Example 3 and Comparative Example 2 was measured. Specifically, light was caused to be incident onto the surface of the reflective layer in the normal direction and the amount of reflected light including diffusively reflected light was measured to determine the reflectance R. The measurement results are described in FIG. 9. FIG. 9 also illustrates results obtained by simulation. In the simulation, the relationship between the thickness of the reflective layer and the reflectance R was measured assuming that the volume percentage of the pores to the base material was 27 vol %.

As illustrated in FIG. 9, the reflective layers of Example 3 which included porous particles achieved an enhancement in the reflectance R, for example, to about 98%. On the other hand, the reflective layers of Comparative Example 2 which used hollow particles exhibited a reflectance R of about 80% when the thickness of the reflective layer was 5 mm. These results show that the use of porous particles provides a higher reflectance.

The values of the reflectance R actually measured of the reflective layers of Comparative Example 2 were far below the simulation results. This is ascribed to the fact that the surface resistance of the hollow particles caused the volume percentage after the kneading to be as low as about 10 vol % and also to the fact that some hollow particles had been broken during the kneading of the hollow particles in the resin and the actual volume percentage of the pores was decreased (see FIG. 17). In contrast, the values of the reflectance R actually measured in Example 3 were in substantial agreement with the simulation results when the thickness of the reflective layers was sufficiently large (for example, 3 mm and more). These results confirmed that the porous particles used in Example 3 had high durability and were resistant to breakage during the production process.

Second Embodiment

The second embodiment is directed to light-emitting devices which have a reflective layer including the light reflective material 100. In the following, organic EL devices will be described as an example of the light-emitting devices of the present embodiment.

Figure 10:
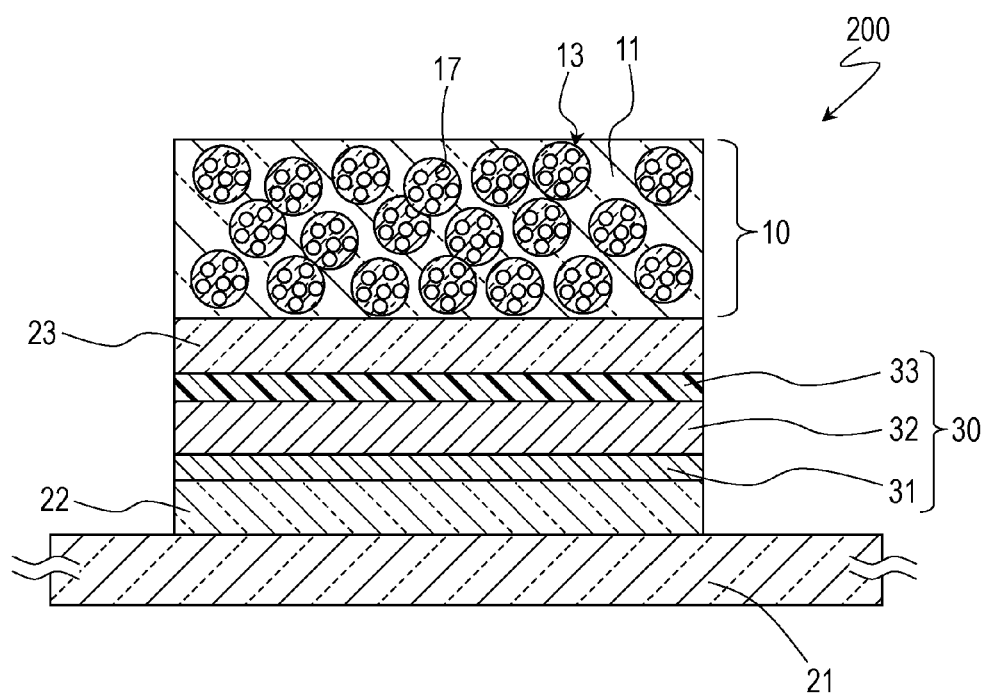
FIG. 10 is a schematic sectional view illustrating an example of an organic EL device according to a second embodiment.

FIG. 10 is a schematic sectional view illustrating an example of organic EL devices 200 in the present embodiment.

The organic EL device 200 includes a substrate 21, a lower electrode layer 22 supported on the substrate 21, an upper electrode layer 23, an organic layer 30 as a functional layer disposed between the lower electrode layer 22 and the upper electrode layer 23, and a reflective layer 10 disposed on the side of the upper electrode layer 23 opposite to the organic layer 30. The organic layer 30 includes at least a luminescent layer 33. As an example, the organic layer 30 illustrated here includes the luminescent layer 33, a hole injection layer 31 and a hole transport layer 32.

The reflective layer 10 includes the light reflective material 100. In this case, the reflective layer 10 may be entirely composed of the light reflective material 100 or may include the light reflective material 100 as a layer that constitutes the reflective layer 10 including a plurality of layers. The reflective layer 10 includes a base material 11 and a plurality of porous particles 13. The porous particles 13 each include a shell 15 containing a plurality of pores 17 in the shell. The shells 15 have a refractive index higher than the refractive index of the base material 11.

The lower electrode layer 22 and the upper electrode layer 23 have light transmission property. Here, the phrase "have light transmission property" means that when visible light including at least first light is passed through the lower electrode layer or the upper electrode layer, the electrode layer absorbs, for example, not more than 50% of the light. One or both of the lower electrode layer and the upper electrode layer may be formed of a transparent conductive material.

In the present embodiment, the "first light" may be any light component present in the light (visible light) emitted by the luminescent layer 33. For example, the wavelength of the "first light" is the peak wavelength of the light emitted from the luminescent layer 33. The wavelength of the first light is in the band of wavelengths emitted from the luminescent layer 33 and does not need to be the peak wavelength.

As already mentioned hereinabove, a conventional light-emitting device including a metallic reflective layer (see FIG. 16A) has a problem in that light reflected by, for example, the surface of the reflective layer is confined in the device and cannot be often extracted out of the device. Part of the waveguided light is absorbed when the light repeatedly passes through layers such as organic layers. Further, additional losses may be caused by the absorption of light by the metallic reflective layer and also by the surface plasmon. It is therefore difficult for the light generated in the luminescent layer to be efficiently extracted out of the device.

In contrast, in the organic EL device 200, the light generated in the luminescent layer 33 is incident onto the reflective layer 10 and is diffusively reflected. Consequently, the amount of waveguided light may be reduced. The diffusively reflected light may be extracted through the substrate 21 side. As mentioned hereinabove, the reflective layer 10 may achieve a higher reflectance than a reflective layer having a structure in which, for example, simple pores are disposed in a base material (FIG. 16B). Unlike metallic reflective layers, the reflective layer 10 does not cause a loss by the absorption of light by metal materials, or a loss by surface plasmon. Thus, the light extraction efficiency may be enhanced over that heretofore achieved, and the power efficiency of the light-emitting devices may be improved.

Because the light is diffusively reflected in the reflective layer 10 in the present embodiment, no strong interference by specular reflection occurs in contrast to when metallic reflective layers are used. Consequently, the devices have high robustness to the variation in the thicknesses of the constituent layers.

The refractive index of the base material 11 in the reflective layer 10 may be equal to or higher than the refractive index of the luminescent layer 33. With this configuration, light generated in the luminescent layer 33 may be prevented from being totally reflected at the interface between the reflective layer 10 and the layer adjacent to the organic layer 30 side of the reflective layer 10. As a result, the light from the luminescent layer 33 is allowed to be incident onto the reflective layer 10 more efficiently.

The refractive index of the upper electrode layer 23 may be equal to or higher than the refractive index of the luminescent layer 33. With this configuration, light emitted from the luminescent layer 33 toward the reflective layer 10 may reach the reflective layer 10 without being totally reflected at the interface between the upper electrode layer 23 and the organic layer 30. As a result, the light from the luminescent layer 33 is allowed to be incident onto the reflective layer 10 more efficiently.

<Elements Constituting Organic EL Device 200>

[Substrate 21]

Examples of the substrate 21 include glass substrates and plastic plates. Examples of the materials of the glass substrates include quartz glass, soda-lime glass and alkali-free glass. Examples of the materials of the plastic plates include polyethylene terephthalate, polyethylene naphthalate, polyether sulfone and polycarbonate. When a plastic plate is used, a film such as a SiON film or a SiN film may be formed on the surface of the plastic plate. In this manner, the penetration of water may be suppressed. The substrate may be rigid or flexible.

[Organic Layer 30]

The organic layer 30 includes at least the luminescent layer. Where necessary, the organic layer 30 may further include other layers in addition to the luminescent layer, such as hole injection layers, hole transport layers, interlayers, electron transport layers and electron injection layers. The luminescent layer 33 may be a monolayer structure or a multilayer structure. When, for example, white light is the desired light, the luminescent layer 33 may be doped with three types of dopant pigments, namely, red, green and blue pigments. It is also possible to adopt a stack including a hole transport blue light-emitting layer, an electron transport green light-emitting layer and an electron transport red light-emitting layer, or a stack including an electron transport blue light-emitting layer, an electron transport green light-emitting layer and an electron transport red light-emitting layer.

Examples of the materials of the luminescent layer 33 include polyparaphenylenevinylene derivatives, polythiophene derivatives, polyparaphenylene derivatives, polysilane derivatives, polyacetylene derivatives, polyfluorene derivatives, polyvinylcarbazole derivatives, pigments, and polymers of metal complex luminescent materials. Examples of the materials further include low-molecular luminescent materials such as anthracene, naphthalene, pyrene and metal complex luminescent materials. The materials of the luminescent layer 33 are not limited to those described hereinabove.

Examples of the materials of the electron injection layers include metal halides, with specific examples including metal fluorides such as lithium fluoride and magnesium fluoride, and metal chlorides such as sodium chloride and magnesium chloride. Examples further include oxides of metals such as titanium, zinc, magnesium, calcium, barium and strontium.

The materials of the electron transport layers may be selected from compounds having electron transport properties. Examples of such compounds include metal complexes known as electron transport materials such as Alq$_3$, and heterocyclic compounds such as phenanthroline derivatives, pyridine derivatives, tetrazine derivatives, oxadiazole derivatives and triazole (TAZ) derivatives. The materials of the electron transport layers are not limited to these materials, and any known appropriate electron transport materials may be used.

Examples of the materials of the hole transport layers include low-molecular materials and high-molecular materials having a low LUMO (lowest unoccupied molecular orbital) level.

Examples of the materials of the hole injection layer 31 include organic materials including thiophene, triphenylmethane, hydrazoline, amylamine, hydrazone, stilbene and triphenylamine.

The interlayers may have a carrier blocking function to prevent the leakage of carriers from the luminescent layer side. In the present embodiment, the interlayer forms an electron blocking layer that prevents the leakage of electrons from the luminescent layer side. By including the interlayer, the organic EL device achieves an enhancement in luminous efficiency and an increase in life. Examples of the materials of the interlayers include polyarylamine and derivatives thereof, polyfluorene and derivatives thereof, polyvinylcarbazole and derivatives thereof, and triphenyldiamine derivatives.

These organic materials may be selected and used appropriately as required. These organic materials may be formed into films by wet processes such as coating methods, or dry processes such as vacuum deposition methods and transfer methods. Examples of the coating methods include spin coating methods, spray coating methods, die coating methods, gravure printing methods and screen printing methods.

[Lower Electrode Layer and Upper Electrode Layer]

One of the lower electrode layer 22 and the upper electrode layer 23 serves as an anode and the other as a cathode. The materials of the anode and the cathode may be conductive materials having relatively low light-absorbing properties. Examples of such materials include metals such as gold (Au) and aluminum (Al), metal oxides such as ITO, conductive polymers, and light transmissive resins containing metal nanoparticles or metal nanowires.

Examples of the metal oxides include ITO (indium-tin oxide), $SnO_2$, ZnO, IZO (indium-zinc oxide) and GZO (gallium-zinc oxide). The electrodes may be formed from these materials by a method such as a vacuum deposition method or a sputtering method.

Examples of the conductive polymers include conductive polymer materials such as polythiophene, polyaniline, polypyrrole, polyphenylene, polyphenylenevinylene, polyacetylene and polycarbazole. To increase the conductivity, for example, the conductive materials may be doped with dopants such as sulfonic acid, Lewis acids, protonic acids, alkali metals and alkaline earth metals.

Examples of the conductive substances such as metal nanoparticles and metal nanowires added to the light transmissive resin films include metals such as silver, gold and copper. Examples of the resins include acrylic resins, polyethylenes, polypropylenes, polyethylene terephthalates, polymethyl methacrylates, polystyrenes, polyethersulfones, polyarylates, polycarbonate resins, polyurethanes, polyacrylonitriles, polyvinyl acetals, polyamides, polyimides, diacrylic phthalate resins, cellulose resins, polyvinyl chlorides, polyvinylidene chlorides, polyvinyl acetates, other thermoplastic resins, and copolymers of two or more kinds of monomers constituting these resins.

The conductive polymer materials, and the light transmissive resins containing metal nanoparticles or metal nanowires may be formed into films by wet processes such as coating methods or dry processes such as transfer methods.

In the present embodiment, the materials, the thicknesses and the methods for the formation of the lower electrode layer 22 and the upper electrode layer 23 may be selected so that the light transmittances of the electrodes will be, for example, 50% or above, and more desirably 70% or above.

In the organic EL device 200, the lower electrode layer 22 and the organic layer 30 are formed on the substrate 21 and thereafter the upper electrode layer 23 is formed on the organic layer 30. It is therefore sometimes difficult to form the upper electrode layer 23 under the same conditions as the lower electrode layer 22. In the formation of the upper electrode layer 23, conditions such as temperature may be set in consideration of the heat resistance of the materials used as the organic layer 30. For example, some of the factors that cause damages to the organic layer 30 in the case of sputtering are heating temperature and ion collision, and those in the case of coating are the permeation of impurities present in the coating material into the organic layer 30 and drying temperature.

For example, the lower electrode layer 22 and the upper electrode layer 23 may be ITO films. ITO films are crystallized at a heating temperature of about 180° C., and change their characteristics after the crystallization. Typically, ITO films formed at a temperature of 200° C. or above are used as transparent electrodes in bottom-emission organic EL devices. ITO films formed at 200° C. or above have higher conductivity than ITO films formed at a lower temperature, and exhibit high transparency and small light absorption. For these reasons, the lower electrode layer 22 in the present embodiment may be an ITO film formed at a temperature of, for example, 200° C. or above. On the other hand, the upper electrode layer 23 is formed at a temperature of, for example, less than 200° C. in consideration of the heat resistance of the materials used as the organic layer 30 on which the upper electrode layer 23 is formed.

[Reflective Layer 10]

The reflective layer 10 includes a base material 11 and a plurality of porous particles 13. The porous particles 13 each include a shell 15 containing a plurality of pores 17 in the shell. The refractive index of the shells 15 is higher than the refractive index of the base material 11. The configurations such as the materials and the sizes of these constituent elements are the same as in the first embodiment, and the description thereof will be omitted.

The reflective layer 10 may serve as a diffusive reflective layer. The reflective layer 10 may have flexibility. For example, the reflectance of the reflective layer 10 is 60% or more, and desirably 80% or more. In the present embodiment, for example, the reflective layer 10 may be designed so as to exhibit a reflectance that is equal to or greater than the highest reflectance of metals, namely, the reflectance of silver (95%).

The base material 11 may have a refractive index higher than the refractive index of the luminescent layer 33. With this configuration, light emitted from the luminescent layer 33 may be prevented from being totally reflected at the interface between the reflective layer 10 and the layer adjacent to the luminescent layer 33 side of the reflective layer 10 (in this case, the upper electrode layer 23). Thus, the light emitted from the luminescent layer 33 is allowed to be incident onto the reflective layer 10 more efficiently.

The organic EL device 200 may further include a light extraction layer. The light extraction layer may be any layer which can disturb the reflection angle or the refraction angle of light. When the light extraction layer is interposed between, for example, two layers having different refractive indexes, the angle which causes light to be totally reflected at the interface may be changed. In this manner, part of light which will be totally reflected without the light extraction layer may pass through the interface at an angle below the critical angle. For example, the light extraction layer may be a layer having irregularities on the surface, a layer including a light reflective interface in the layer, or a layer including an interface formed by a contact between media with different refractive indexes. Alternatively, the light extraction layer may be a layer containing particles or pores, or a layer formed of a mixture of a plurality of materials.

While the present embodiment has been described with respect to the organic EL devices as an example, the technique of the present disclosure is applicable to a wide range of light-emitting devices such as, for example, inorganic EL devices including inorganic materials such as zinc sulfide as luminescent layers. The technique of the present disclosure may be applied to light-emitting devices including light emitters, such as organic EL devices, inorganic EL devices, LEDs and semiconductor lasers. Light may be extracted efficiently by arranging the reflective layer of the present disclosure so as to cover a portion of the light emitter.

Third Embodiment

The third embodiment is directed to light-emitting devices including a reflective layer. The light-emitting device of the present embodiment includes a light emitter that emits light by absorbing excitation light, and a reflective layer disposed to cover a portion of the surface of the light emitter. The reflective layer includes the light reflective material 100 described hereinabove with reference to FIG. 1, and is capable of diffusively reflecting light emitted from the light emitter.

Figure 11:
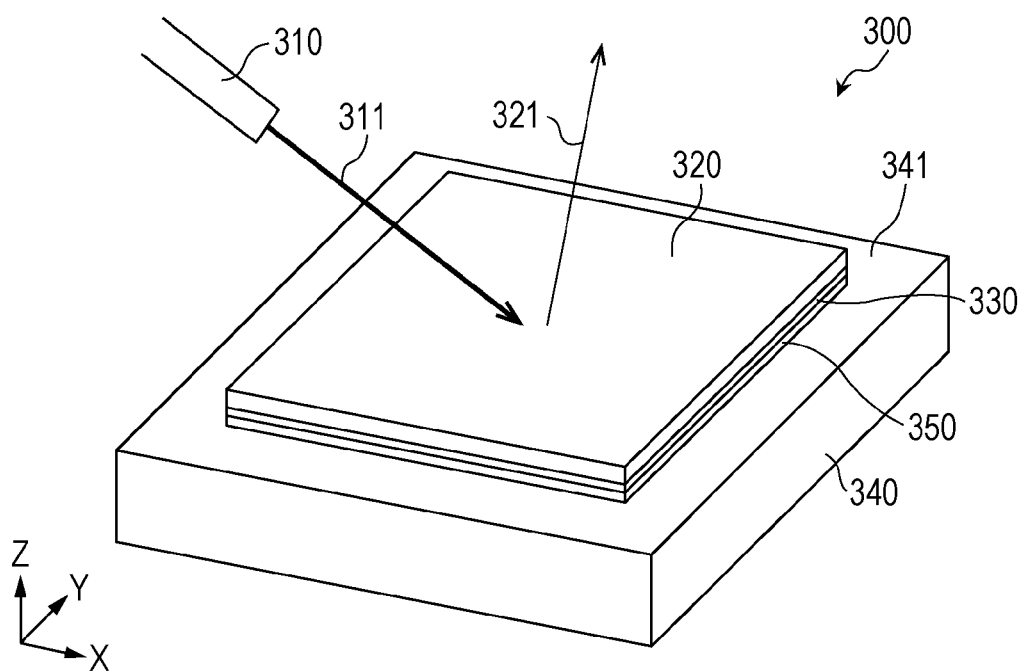
FIG. 11 is a schematic perspective view illustrating an example of a light-emitting device according to a third embodiment.
Figure 12:
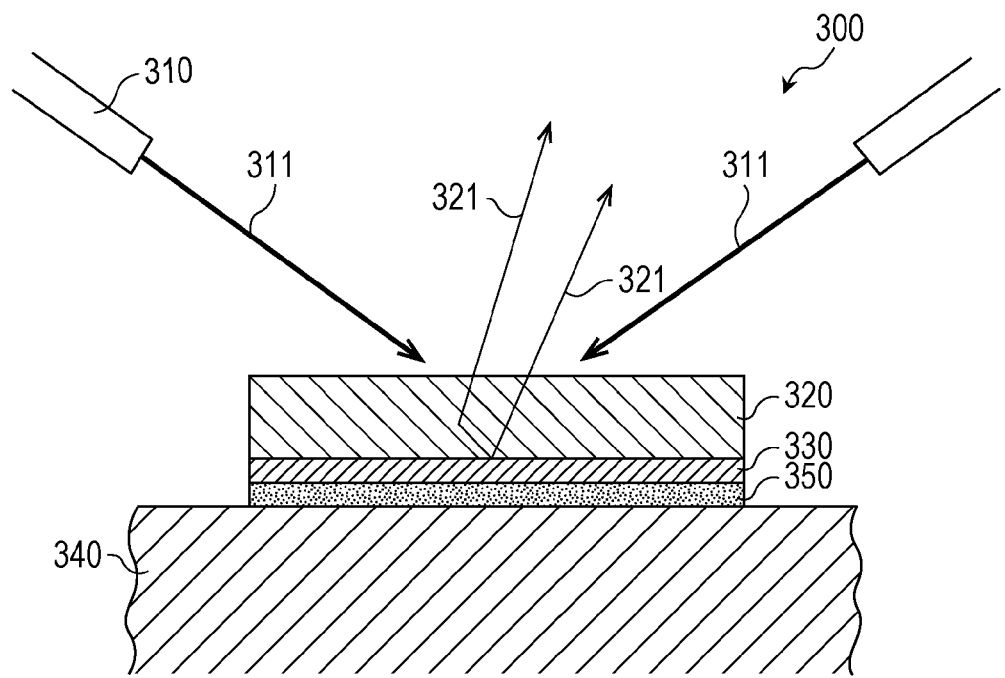
FIG. 12 is a schematic sectional view illustrating an example of the light-emitting device.

Hereinbelow, an example of the light-emitting devices of the present embodiment will be described with reference to the drawings. FIGS. 11 and 12 are a schematic perspective view and a schematic sectional view, respectively, illustrating an example of a light-emitting device 300 according to the present embodiment.

The light-emitting device 300 includes an excitation light source 310 that emits excitation light, a light emitter 320, a reflective layer 330 and a heatsink 340. An adhesive layer 350 may be disposed between the heatsink 340 and the reflective layer 330. In this example, the light emitter 320 is a ceramic phosphor and the excitation light source 310 is a laser light source.

When the laser light source 310 applies laser light 311 toward the ceramic phosphor 320, the ceramic phosphor 320 emits light 321. The ceramic phosphor 320 is fixed on a mounting surface 341 of the heatsink 340 with the reflective layer 330 and the adhesive layer 350 interposed therebetween.

In FIGS. 11 and 12, the direction of the normal to the surface (the mounting surface) 341 of the heatsink 340 on which the ceramic phosphor 320 is mounted is defined as the Z-axis direction. Two directions that are perpendicular to the Z-axis direction and are orthogonal to each other are defined as the X-axis direction and the Y-axis direction. In other words, the mounting surface 341 is in parallel to the XY plane.

Hereinbelow, elements constituting the light-emitting device 300 of the present embodiment will be described in detail.

[Laser Light Source]

For example, the laser light source 310 is a semiconductor laser or an light-emitting diode (LED), and is driven by a driving current to emit laser light having a prescribed wavelength toward the ceramic phosphor 320. Specifically, the laser light source 310 emits a UV ray or a violet or blue visible light as the laser light 311. The laser light 311 serves to excite the phosphor present in the ceramic phosphor 320. The laser light 311 has an appropriate intensity and an appropriate wavelength to excite electrons in the phosphor.

While FIG. 11 illustrates one laser light source 310, the light-emitting device 300 may include a plurality of laser light sources 310 as illustrated in FIG. 12. The plurality of laser light sources 310 are arranged so as to apply the laser light 311 to the ceramic phosphor 320 from different directions. For example, the plurality of laser light sources 310 may be arranged in a circle surrounding the ceramic phosphor 320.

[Ceramic Phosphor]

The ceramic phosphor 320 is a ceramic phosphor that is excited by laser light. The ceramic phosphor 320 is formed of a plate-shaped ceramic containing a phosphor. Specifically, as illustrated in FIGS. 11 and 12, the ceramic phosphor 320 is a single ceramic plate having two principal surfaces opposite to each other. The ceramic phosphor may be a single monocrystal or a single polycrystal. Alternatively, the ceramic phosphor may have a structure in which phosphor particles are dispersed in the entirety of the phosphor 320. One (the upper surface) of the two principal surfaces is a laser irradiation surface to which the laser light 311 will be applied. The other (the lower surface) of the two principal surfaces is adjacent to the reflective layer 330.

As illustrated in FIG. 11, the shape in a plan view of the ceramic phosphor 320 is, for example, a rectangle. In the present embodiment, the term "plan view" means that the object is viewed from the side on which the laser light 311 is applied, namely, in the direction opposite to the Z-axis direction. The shapes in a plan view of the ceramic phosphor 320 are not limited to rectangles and may be other shapes such as squares, circles or ellipses.

In the present embodiment, the ceramic phosphor 320 is a plate formed of a ceramic such as alumina (aluminum oxide ($Al_2O_3$)). The ceramic is not limited to alumina and may be other ceramic such as, for example, zirconia (zirconium oxide ($ZrO_2$)) or zinc oxide (ZnO).

The ceramic phosphor 320 may be a monocrystal. The monocrystalline ceramic phosphor 320 may be produced by a known technique such as, for example, the technique disclosed in Japanese Unexamined Patent Application Publication No. 5-335678. Alternatively, the ceramic phosphor 320 may be produced by adding a binder to a mixture of a ceramic raw material such as alumina particles, a scatterer or a sintering auxiliary (an additive) and a phosphor, and thermally shaping and calcining the resultant mixture.

For example, the phosphor may be a yellow phosphor, a red phosphor, a green phosphor or a combination thereof. Examples of the phosphors include YAG phosphor particles and CASN ($CaAlSiN_3$).

In the ceramic phosphor 320, electrons in the phosphor are excited by the application of the laser light 311. The excited electrons return to the ground state while emitting light (fluorescence). Part of the fluorescence is emitted directly to the laser light 311 irradiation side, and other part of the light is reflected by the reflective layer 330 and is emitted to the laser light 311 irradiation side.

The light 321 emitted from the ceramic phosphor 320 may include the fluorescence emitted by the phosphor and the laser light 311 used as the excitation light. That is, the light 321 emitted from the light-emitting device 300 may be synthetic light combining the fluorescence and the laser light 311. When, for example, the laser light 311 is blue light, the laser light 311 is scattered in the inside of the ceramic phosphor 320 and partly comes out as blue light without being absorbed by the phosphor and being converted to other wavelengths. Thus, the ceramic phosphor 320 can emit white light 321 by utilizing such blue light and the fluorescence (for example, yellow light) emitted by the phosphor.

[Reflective Layer]

The reflective layer 330 has light-reflecting properties and is disposed in contact with the surface of the ceramic phosphor 320 that is other than the laser irradiation surface (the upper surface). Specifically, the reflective layer 330 is disposed in contact with the surface (the lower surface) opposite to the laser irradiation surface. More specifically, the reflective layer 330 is disposed in contact with the entirety of the lower surface of the ceramic phosphor 320.

The reflective layer 330 reflects the light 321 that has traveled to the lower surface of the ceramic phosphor 320. Specifically, the reflective layer 330 reflects the laser light 311 and the fluorescence emitted from the ceramic phosphor 320. By the reflection of the fluorescence by the reflective layer 330, the efficiency in extracting the light through the top surface may be enhanced. Further, the reflection of the laser light 311 by the reflective layer 330 makes it possible to further excite electrons in the phosphor of the ceramic phosphor 320 by the reflected laser light 311. In this manner, the amount of the fluorescence may be increased and the light extraction efficiency may be further enhanced.

In the present embodiment, the reflective layer 330 includes the light reflective material 100 described hereinabove with reference to FIG. 1. That is, the reflective layer 330 includes a base material and a plurality of porous particles. The base material may be a light transmissive, organic or inorganic substance. That is, the base material has light transmission property. The porous particles each include a shell containing a plurality of pores in the shell. The refractive index of the shells is higher than the refractive index of the base material. The refractive index of the base material is not particularly limited but is desirably similar to the refractive index of the ceramic phosphor 320 (for example, 1.7). For example, the thickness of the reflective layer 330 is 50 μm to 100 μm.

In a light-emitting device using a ceramic phosphor, light needs to be extracted with high efficiency through the upper surface of the ceramic phosphor in order to achieve good power efficiency. For this purpose, for example, conventional light-emitting devices have a metallic reflective layer adjacent to the lower surface of the ceramic phosphor. However, as described hereinabove, light reflected by the surface of the metallic reflective layer is confined within the device and cannot often be extracted out of the device.

Similar problems may be encountered also in the case where a multilayer structure including layers with different refractive indexes is used in place of the metallic reflective layer. Such a multilayer structure used as a reflective layer often exhibits incident wavelength selectivity or incident angle selectivity and thus often fails to reflect light emitted from the ceramic phosphor with a sufficient reflectance.

When, for example, the ceramic phosphor is a monocrystal, the difference between the refractive index of the ceramic phosphor and the refractive index of its surrounding determines the critical angle (for example, 36° when the refractive index of the ceramic phosphor is 1.7). Light components having an angle equal to or greater than the critical angle propagate as waveguided light. Part of the waveguided light is absorbed while repeatedly passing through the ceramic phosphor. Further, additional losses may be caused by the absorption of light by a metallic reflective layer and also by the surface plasmon. It is therefore difficult for the light generated in the ceramic phosphor to be efficiently extracted out of the device.

Another form of ceramic phosphors is a dispersion of phosphor particles throughout the ceramic phosphor. In this case, the volume percentage of the phosphor particles in the ceramic phosphor is desirably, for example, 40 vol % or above from the viewpoint of conversion efficiency of laser light to fluorescence. For example, the particle diameter of the phosphor particles is desirably 10 μm or above. Under these conditions, however, the scattering of light in the inside of the ceramic phosphor is weak and it is difficult to reduce the amount of waveguided light sufficiently.

In contrast, the light-emitting device 300 according to the present embodiment allows for the reduction in the amount of waveguided light because the light emitted by the ceramic phosphor 320 is incident on the reflective layer 330 and is diffusively reflected. As already mentioned hereinabove, the reflective layer 330 may achieve a higher reflectance than a reflective layer having a structure in which, for example, simple pores are disposed in a base material (FIG. 16B). Unlike metallic reflective layers, the reflective layer 330 does not cause a loss by the absorption of light by metal materials, or a loss by surface plasmon. Thus, the light extraction efficiency may be enhanced over that heretofore achieved, and the power efficiency of the light-emitting devices may be improved.

When heat is applied such as when the production adopts a heating process, a conventional structure in which a metallic reflective layer is disposed adjacent to the lower surface of a ceramic phosphor has a risk that separation may be caused due to the difference in thermal expansion between the ceramic phosphor and the metallic reflective layer. In contrast, the present embodiment does not involve any metallic reflective layers and hence can eliminate the occurrence of separation ascribed to the difference in thermal expansion.

[Heatsink]

The heatsink 340 is an example of radiators on which the ceramic phosphor 320 is mounted. The heatsink 340 is a radiating member for releasing heat generated by the phosphor present in the ceramic phosphor 320 to the outside (in the air). Thus, the heatsink 340 may be made of a material having high thermal conductivity such as a metal. For example, the heatsink 340 may be an aluminum die-cast of an aluminum alloy. For example, the heatsink 340 may be provided with a plurality of radiation fins (not shown).

The mounting surface 341 of the heatsink 340 is one of the surfaces of the heatsink 340, and the ceramic phosphor 320 is mounted thereon. Specifically, the ceramic phosphor 320 is mounted on the mounting surface 341 so as to interpose the reflective layer 330 and the adhesive layer 350 therebetween. More specifically, the ceramic phosphor 320 having the reflective layer 330 on its lower surface is mounted on the mounting surface 341 coated with an adhesive material (the adhesive layer 350). In this manner, the ceramic phosphor 320 may be easily fixed on the heatsink 340.

[Adhesive Layer]

The adhesive layer 350 is formed of a thermally conductive material and bonds the reflective layer 330 and the heatsink 340 to each other. Examples of the adhesive layer 350 include solder and silver paste. The adhesive layer 350 is not limited to metal materials and may be any of grease and resin materials such as SARCON sheets ("SARCON" is a registered trademark). For example, the adhesive layer 350 may be a material having a thermal conductivity of 1 W/m·K to 100 W/m·K or above.

The reflective layer 330 may be disposed directly on the surface of the heatsink 340. In this case, the adhesive layer 350 between the heatsink 340 and the reflective layer 330 may be omitted.

While the present embodiment illustrates the light-emitting device 300 as having the laser light source 310, the light-emitting device 300 may be free from laser light sources 310. For example, the ceramic phosphor 320 may be caused to emit light 321 by the application of laser light from other laser light source.

While, for example, the present embodiment illustrates the light-emitting device 300 as having the heatsink 340, the light-emitting device 300 may be free from dissipators such as the heatsink 340. For example, the ceramic phosphor 320 may be mounted on a member other than radiators or may be held with a holder such as a clip. Even in the absence of the heatsink 340, the device may achieve an enhancement in light extraction efficiency by virtue of the reflection of the light 321 by the reflective layer 330.

While, for example, the present embodiment illustrates the ceramic phosphor 320 as being formed by sintering a mixture of a phosphor and ceramic particles, the fabrication method is not limited thereto and the ceramic phosphor 320 may be prepared by, for example, ceramic thin-film growth.

While, for example, the present embodiment illustrates the ceramic phosphor 320 as being a single plate, the ceramic phosphor 320 is not limited to plates and may be a polyhedron such as a partly broken plate.

While, for example, the present embodiment illustrates the laser light 311 as being applied onto one of the two principal surfaces of the ceramic phosphor 320, the laser light 311 may be applied onto an end face of the ceramic phosphor 320.

Specifically, the ceramic phosphor 320 may include a luminous section containing a phosphor which is excited by laser light, and a reflective section that is disposed to surround the luminous section and reflects light from the luminous section. More specifically, the luminous section and the reflective section may be disposed in a single layer. For example, a layer of alumina particles (ceramic particles) which contains a phosphor only in a prescribed region of the layer may be calcined to form a phosphor-containing luminous section and a phosphor-free reflective section in the single layer.

The light-emitting device 300 of the present embodiment may be used in various applications such as, for example, illumination devices, projectors and laser pointers.

Fourth Embodiment

The fourth embodiment is directed to light-emitting devices including a reflective layer and an optical fiber. The light-emitting device of the present embodiment includes a light emitter that emits light by absorbing excitation light, a reflective layer disposed to cover a portion of the surface of the light emitter, and an optical fiber. The optical fiber in the light-emitting device of the present embodiment may be a first optical fiber that allows light from the light emitter into the fiber through its one end and emits the light through the other end. Alternatively, the optical fiber in the light-emitting device of the present embodiment may be a second optical fiber that allows excitation light from an excitation light source into the fiber through its one end and emits the excitation light toward the light emitter through the other end. The light-emitting device of the present embodiment may include both the first optical fiber and the second optical fiber.

Figure 13:
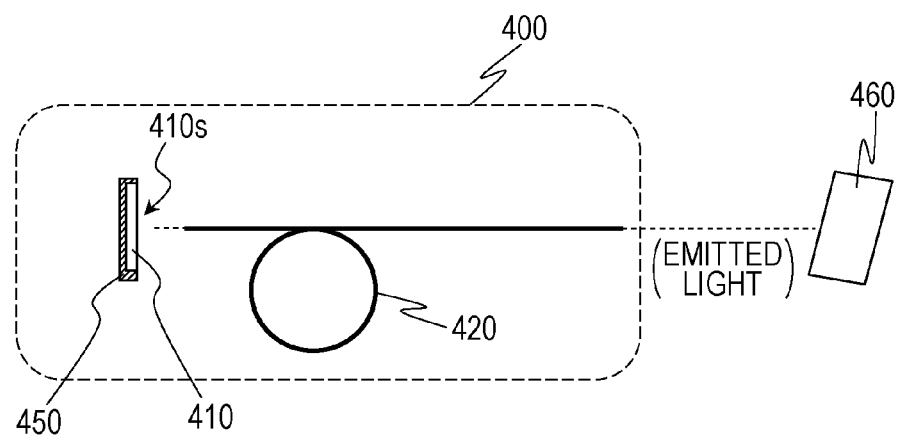
FIG. 13 is a view schematically illustrating an example of a light-emitting device according to a fourth embodiment.

FIG. 13 is a view schematically illustrating an example of a light-emitting device 400 according to the present embodiment. The light-emitting device 400 illustrated in FIG. 13 is a fiber illumination device. The light-emitting device 400 includes a light emitter 410, a reflective layer 450 covering a portion of the surface of the light emitter 410, and an optical fiber 420 that allows light from the light emitter 410 into the fiber through its one end and emits the light through the other end. For example, the light emitter 410 emits light from one principal surface (hereinafter, written as the "first principal surface) 410s of the two principal surfaces. The optical fiber 420 allows the light emitted by the light emitter 410 to propagate therethrough and emits the light to an object 460. The object 460 is an object under test and is also called specimen. In this example, the excitation light is caused to be incident on the first principal surface 410s that is the emission surface of the light emitter 410. However, the excitation light may be caused to be incident onto the other principal surface (hereinafter, written as the "second principal surface") of the light emitter 410 or onto a side surface of the light emitter 410.

The light emitter 410 may include a material that emits light upon irradiation with excitation light (a photoluminescent material). The term "photoluminescent materials" comprehends fluorescent materials and phosphorescent materials in a narrow sense. The term comprehends not only inorganic materials but also organic materials (for example, pigments), and further comprehends quantum dots (semiconductor fine particles). For example, the light emitter 410 in the present embodiment may be a ceramic phosphor. The ceramic phosphor may have the same configuration as the ceramic phosphor 320 described hereinabove (FIGS. 11 and 13).

The reflective layer 450 includes the light reflective material 100 (FIG. 1). The reflective layer 450 may have the same configuration as the reflective layer 330 described hereinabove (FIGS. 11 and 13). The reflective layer 450 is disposed on at least a portion or the entirety of the surface of the light emitter 410 except the regions through which the light emitter is irradiated with the excitation light and emits light (in this case, except the first principal surface 410s). In this example, the reflective layer 450 is disposed to cover the side surfaces and the second principal surface of the light emitter 410.

The light-emitting device 400 may include an optical system. For example, the optical system has at least any of a lens that focuses the light emitted from the light emitter 410 to the entrance of the optical fiber 420, and a lens that focuses the light emitted from the optical fiber 420.

Modified Examples

Figure 14:
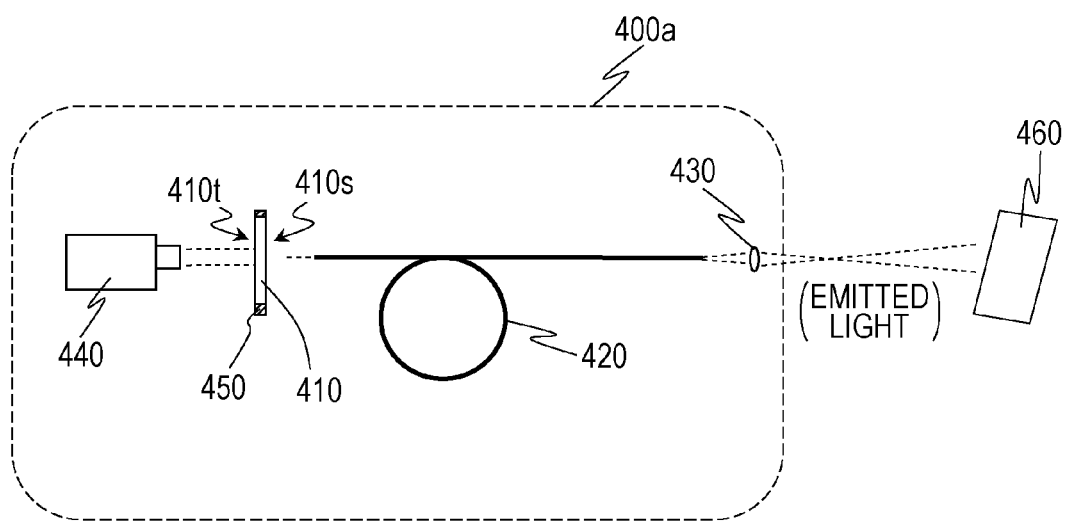
FIG. 14 is a view illustrating another light-emitting device according to the fourth embodiment.

FIG. 14 is a view illustrating another light-emitting device 400a according to the present embodiment. The light-emitting device 400a includes an excitation light source 440 and an optical system 430. For example, the excitation light source 440 emits light in the blue wavelength band as the excitation light. The excitation light source 440 emits the excitation light so that it is incident vertically onto the light emitter 410. The lens configuration of the optical system 430 may be designed appropriately in accordance with the purpose. In this example, the light emitter 410 emits light from its first principal surface 410s. The excitation light is incident through the second principal surface 410t that is opposite to the first principal surface 410s as the emission surface of the light emitter 410. The reflective layer 450 is disposed to cover the side surfaces of the light emitter 410. While FIG. 14 illustrates the light-emitting device 400a as including both the optical system 430 and the excitation light source 440, the light-emitting device 400a may have only one of these components.

Figure 15:
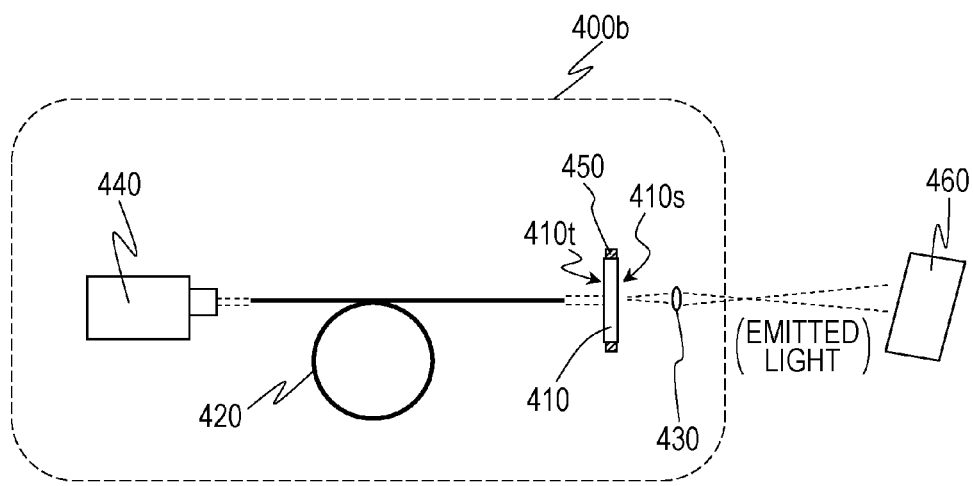
FIG. 15 is a view illustrating still another light-emitting device according to the fourth embodiment.

FIG. 15 is a view illustrating still another light-emitting device 400b according to the present embodiment. The light-emitting device 400b differs from the previous example in that the optical fiber 420 transmits excitation light between the excitation light source 440 and the light emitter 410. The optical fiber 420 allows the excitation light into the fiber through its one end and emits the excitation light toward the light emitter 410 through the other end. In the illustrated example, the optical fiber 420 is arranged so that the excitation light is incident through the second principal surface 410t that is opposite to the emission surface (the first principal surface 410s) of the light emitter 410. The light emitter 410 may be attached to the tip of the optical fiber 420. In this example, the optical system 430 may be similarly omitted.

In the light-emitting devices 400a and 400b described above, the excitation light is incident onto the second principal surface 410t of the light emitter 410. However, the excitation light may be incident onto the first principal surface 410s that is the emission surface of the light emitter 410, or onto a side surface of the light emitter 410. The reflective layer 450 may be disposed on areas except the regions through which the excitation light is applied and the light emitter 410 emits light. When the excitation light is incident onto a side surface of the light emitter 410, the reflective layer 450 may be disposed to cover the second principal surface 410t of the light emitter 410.

The present disclosure covers embodiments obtained by modifying the embodiments described hereinabove in numerous ways occurring to those skilled in the art, and embodiments realized by any combinations of the constituent elements and the functions described in the aforementioned embodiments within the spirit and the scope of the present disclosure.

The light reflective materials of the present disclosure may be applied to a wide range of light-emitting devices including organic EL devices and inorganic EL devices. The light-emitting devices of the present disclosure may be applied to a wide range of optical devices such as, for example, illumination devices, displays and projectors.

What is claimed is:

1. A light reflective material comprising:
a base material having light transmission property; and
a porous particle located in the base material, the porous particle comprising a shell defining pores, the base material having a first refractive index, the shell having a second refractive index higher than the first refractive index.

2. The light reflective material according to claim 1, wherein
a ratio of a volume of the pores to a volume of the base material is 20% or more.

3. A light-emitting device comprising:
a light emitter that emits light; and
a reflective layer that covers a portion of a surface of the light emitter, the reflective layer comprising a base material having light transmission property and a porous particle located in the base material, the porous particle comprising a shell defining pores, the base material having a first refractive index, the shell having a second refractive index higher than the first refractive index.

4. The light-emitting device according to claim 3, wherein the light emitter comprises a photoluminescent material and emits the light by absorbing excitation light.

5. The light-emitting device according to claim 4, further comprising:
a first optical fiber that takes in the light from one end, the first optical fiber emitting the light from the other end.

6. The light-emitting device according to claim 4, further comprising:
a second optical fiber that takes in the excitation light from one end, the second optical fiber emitting the excitation light toward the light emitter from the other end.

7. The light-emitting device according to claim 3, wherein the light emitter comprises
a first electrode having light transmission property,
a second electrode having light transmission property, and
a luminescent layer located between the first electrode and the second electrode;
the light emitter emits the light by the application of voltage between the first electrode and the second electrode; and
the reflective layer is located on a side of the first electrode opposite to the luminescent layer.

8. The light-emitting device according to claim 3, wherein
a ratio of a volume of the pores to a volume of the base material is 20% or more.

* * * * *